US012745453B2

(12) United States Patent
Chen et al.

(10) Patent No.: US 12,745,453 B2
(45) Date of Patent: Sep. 22, 2026

(54) INTEGRATED CIRCUIT DRIVER DEVICE, LAYOUT, AND METHOD

(71) Applicant: TAIWAN SEMICONDUCTOR MANUFACTURING COMPANY, LTD., Hsinchu (TW)

(72) Inventors: Chia-Hui Chen, Hsinchu (TW); Shu-Wei Chung, Hsinchu (TW); Kuei-Feng Yen, Hsinchu (TW); Chia-Jung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 502 days.

(21) Appl. No.: 18/317,481

(22) Filed: May 15, 2023

(65) Prior Publication Data

US 2024/0387537 A1 Nov. 21, 2024

(51) Int. Cl.

| | |
|---|---|
| ***H10D 84/85*** | (2025.01) |
| ***H10D 84/01*** | (2026.01) |
| ***H10D 84/03*** | (2025.01) |
| ***H10W 20/43*** | (2026.01) |

(52) U.S. Cl.

CPC ......... *H10D 84/85* (2025.01); *H10D 84/0186* (2025.01); *H10D 84/038* (2025.01); *H10W 20/43* (2026.01)

(58) Field of Classification Search

CPC ... H01L 23/528; H10D 84/0186; H10D 89/10
See application file for complete search history.

(56) References Cited

U.S. PATENT DOCUMENTS

| | | | | |
|---|---|---|---|---|
| 2019/0378823 | A1 | 12/2019 | Lo Verde et al. | |
| 2020/0105739 | A1* | 4/2020 | Yang | G06F 30/392 |
| 2021/0343699 | A1* | 11/2021 | Kim | G06F 30/394 |
| 2021/0356786 | A1* | 11/2021 | Ozeki | H10D 30/673 |
| 2022/0329244 | A1 | 10/2022 | Lee et al. | |

FOREIGN PATENT DOCUMENTS

| | | |
|---|---|---|
| CN | 110226226 | 4/2023 |
| TW | 202306043 | 2/2023 |
| TW | 202307855 | 2/2023 |

* cited by examiner

*Primary Examiner* — Brian Turner
(74) *Attorney, Agent, or Firm* — Hauptman Ham, LLP

(57) ABSTRACT

An IC driver includes a cascode arrangement of first-type transistors coupled in series with a cascode arrangement of second-type transistors different from the first-type transistors. Each cascode arrangement includes an active area extending in a first direction, gate structures extending perpendicular to the first direction and overlying the active area at locations corresponding to the transistors of the cascode arrangement, first through fourth metal segments extending in the first direction in a first metal layer of the IC, first and second vias electrically coupling respective first and second gate structures to the first and second metal segments, a third via electrically coupling a source terminal of the cascode arrangement to the third metal segment, and a fourth via electrically coupling a drain terminal of the cascode arrangement to the fourth metal segment. The third and fourth metal segments are aligned along the first direction.

20 Claims, 16 Drawing Sheets

INTEGRATED CIRCUIT DRIVER DEVICE, LAYOUT, AND METHOD

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
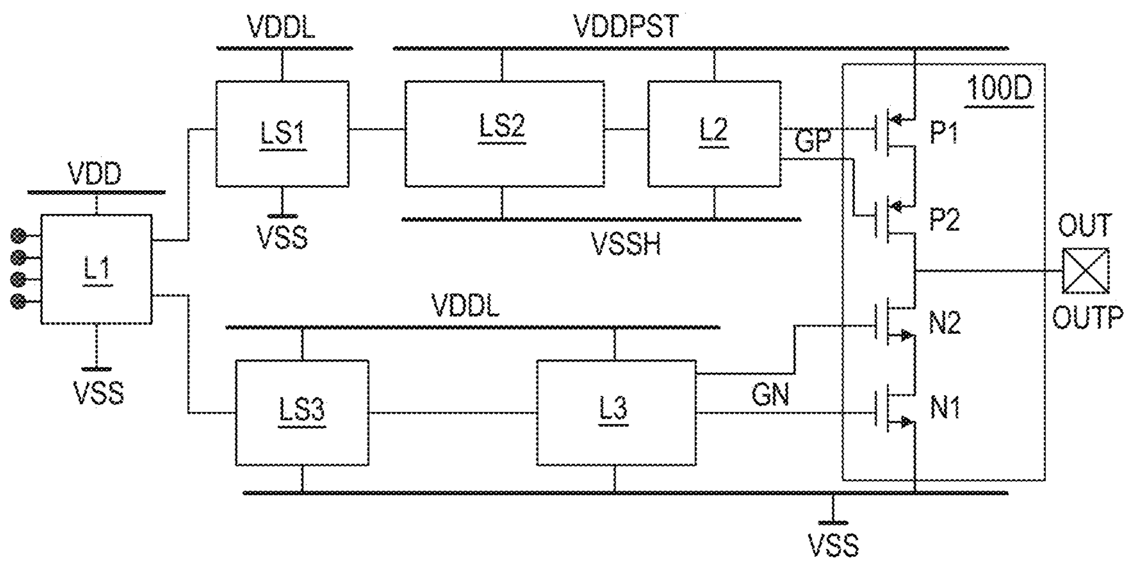
FIG. 1 is a diagram of an IC output circuit, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower.” “above.” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC driver device based on an IC layout diagram includes aligned first metal layer segments having discontinuities, e.g., corresponding to cut-metal regions, whereby source and drain terminals of a cascode transistor arrangement are capable of being aligned along the discontinuous first metal segments. By including aligned metal segments divided into both source and drain connections, the cascode transistor arrangement is capable of including a larger number of parallel connections than cascode transistor arrangements in other approaches, thereby reducing back-end (BE) path resistance and improving speed performance, particularly when included in a driver stage of an output circuit, e.g., an input/output (I/O) circuit based solely on core transistors of a manufacturing process.

Figure 2A:
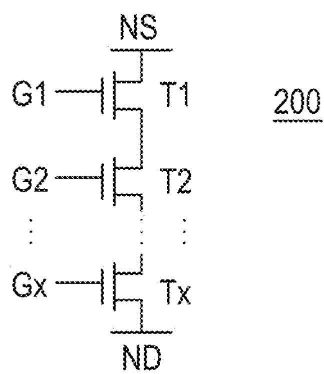
FIG. 2A is a schematic diagram of an IC driver device, in accordance with some embodiments.

As discussed below, FIG. 1 is a schematic diagram of an output circuit including a driver circuit embodiment, FIG. 2A is a schematic diagram of an embodiment of a cascode transistor arrangement, and each of FIGS. 2B-4D depicts a plan and/or cross-sectional view of a corresponding device/layout diagram embodiment in which the reference designators represent both IC device features and the IC layout features used to at least partially define the corresponding IC device features in a manufacturing process, e.g., a method 500 discussed below with respect to FIG. 5 and/or an IC manufacturing flow associated with an IC manufacturing system 800 discussed below with respect to FIG. 8. In some embodiments, one or more of FIGS. 2B-4D is some or all of an IC layout diagram generated by executing some or all of the operations of a method 600 discussed below with respect to FIG. 6, e.g., using a system 700 discussed below with respect to FIG. 7. Accordingly, each of FIGS. 2B-4D represents a plan or cross-sectional view of both an IC layout diagram and a corresponding IC device.

Each of the figures herein, e.g., FIGS. 2B-4D, is simplified for the purpose of illustration. The figures are views of IC structures and devices with various features included and excluded to facilitate the discussion below. In various embodiments, an IC structure, device and/or layout diagram includes one or more features corresponding to power distribution structures, metal interconnects, contacts, vias, gate structures, source/drain (S/D) structures, bulk connections, or other transistor elements, isolation structures, or the like, in addition to the features depicted in FIGS. 2B-4D.

FIG. 1 is a schematic diagram of an output circuit 100, in accordance with some embodiments. Output circuit 100, also referred to as circuit 100 or input/output (I/O) circuit 100 in some embodiments, is an integrated circuit (IC) including a driver 100D, also referred to as a driver stage 100D or a post-driver 100D in some embodiments, configured to output a signal OUT on an output node OUTP, also referred to as an output terminal OUTP or an output pad OUTP in some embodiments.

In the embodiment depicted in FIG. 1, circuit 100 includes logic circuits L1-L3 and level shifters LS1-LS3, power supply nodes VDD, VDDL, and VDDPST configured to receive respective power supply voltages VDD, VDDL, and VDDPST, and reference nodes VSS and VSSH configured to receive respective power supply voltages VDD and VSSH. In some embodiments, one or both of power supply reference voltages VSS or VSSH has a 0 Volt (V), e.g., ground, voltage level.

Logic circuit L1 is configured to receive power supply voltage VDD, power supply reference voltage VSS, and one or more input signals (not labeled). Level shifter LS1 is coupled to logic circuit L1 and configured to receive power supply voltage VDDL, power supply reference voltage VSS, and an output signal (not labeled) from logic circuit L1. Level shifter LS2 and logic circuit L2 are coupled in series to level shifter LS1 and configured to receive power supply voltage VDDPST, power supply reference voltage VSSH, and an output signal (not labeled) from level shifter LS1, and to output gate control signals GP to driver 100D. Level shifter LS3 and logic circuit L3 are coupled in series to logic circuit L1 and configured to receive power supply voltage VDDL, power supply reference voltage VSS, and an output signal (not labeled) from logic circuit L1, and to output gate control signals GN to driver 100D.

Circuit 100 is thereby configured to generate gate control signals GP and GN based on the one or more input signals and the voltage levels of power supply voltages VDD, VDDL, and VDDPST, and power supply reference voltages VSS and VSSH.

Power supply voltage VDD has a core voltage level corresponding to a core power domain of the IC including circuit 100. In some embodiments, circuit 100 includes only transistors, e.g., transistors P1, P2, N1, and N2 discussed below, configured to operate at the core voltage level and capable of being damaged by voltages above the core voltage levels.

In some embodiments, each of power supply voltages VDD, VDDL, and VDDPST has the core voltage level, e.g., 0.75 V. each of power supply reference voltages VSS and VSSH has the ground voltage level, and circuit 100 is configured to output signal OUT based on the core voltage level with respect to ground.

In some embodiments, one or both of power supply voltages VDDL or VDDPST has one or more voltage levels above the core voltage level, e.g., 0.75 V and 1.2 V, respectively, power supply reference voltage VSSH has a voltage level, e.g., 0.45 V, above the voltage level of power supply reference voltage VSS, e.g., ground, and circuit 100 is configured to output signal OUT based on the voltage level of power supply voltage VDDPST with respect to power supply reference voltage VSS.

Driver 100D includes a cascode arrangement of p-type metal-oxide-semiconductor (PMOS) transistors P1 and P2 coupled between power supply node VDDPST and output node OUTP and configured to receive gate control signals GP, and a cascode arrangement of n-type metal-oxide-semiconductor (NMOS) transistors N1 and N2 coupled between output node OUTP and reference node VSS and configured to receive gate control signals GN. Each of the cascode transistor arrangements of driver 100D includes one of IC driver devices 200-400D, also referred to as IC drivers 200-400D in some embodiments, discussed below with respect to FIGS. 2A-4D.

The configuration of circuit 100 including driver 100D depicted in FIG. 1 including totals of two PMOS transistors P1 and P2 being a first-type transistor and two NMOS transistors N1 and N2 being a second-type transistor is a non-limiting example provided for the purpose of illustration. In various embodiments, circuit 100 includes driver 100D including totals of more than two PMOS transistors P1 and P2 and two NMOS transistors N1 and N2, and logic circuits L2 and L3 are configured to output corresponding numbers of gate control signals GP and PN, respectively.

In some embodiments, circuit 100 includes driver 100D including first-type transistors other than PMOS transistors, e.g., p-type transistors other than PMOS transistors or NMOS transistors, and/or second-type transistors other than NMOS transistors, e.g., n-type transistors other than NMOS transistors or PMOS transistors.

In various embodiments, circuit 100 includes power supply nodes, reference nodes, logic circuits, level shifters, and/or additional circuits otherwise configured to output gate control signals GP and GN to driver 100D.

By including driver 100D including cascode transistor arrangements including instances of IC driver devices 200-400D, circuit 100 is capable of realizing the benefits of IC driver devices 200-400D discussed below.

Figure 2B:
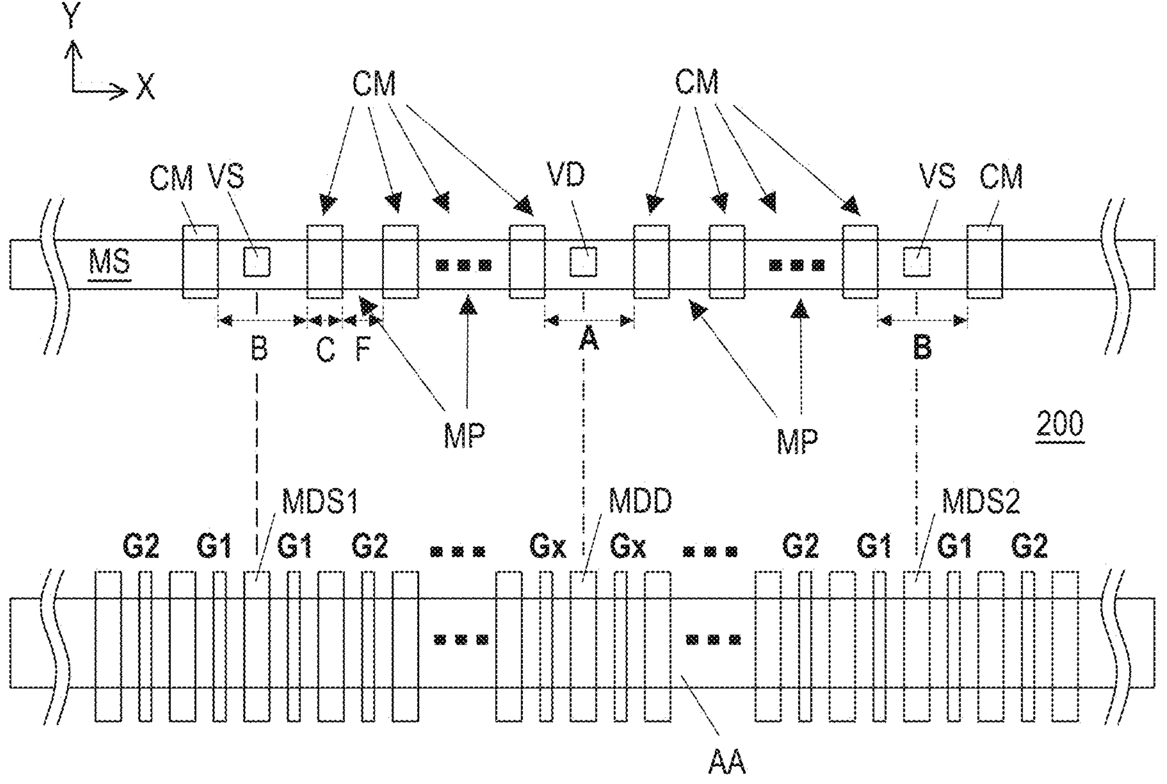
FIG. 2B is a diagram of an IC driver layout and device, in accordance with some embodiments.
Figure 2C:
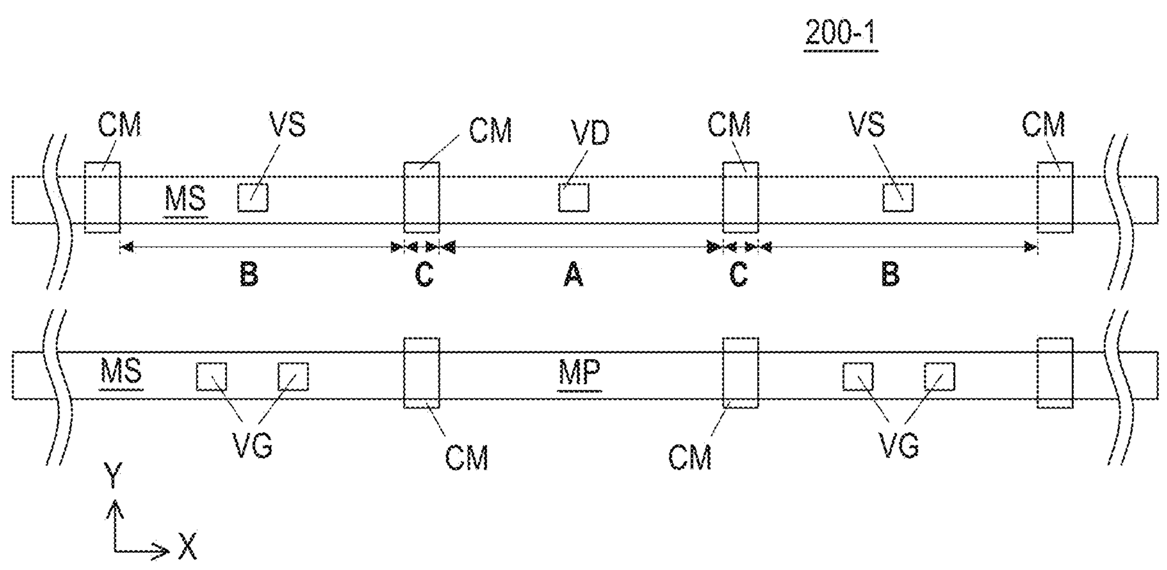
FIG. 2C is a diagram of an IC driver layout and device, in accordance with some embodiments.
Figure 2D:
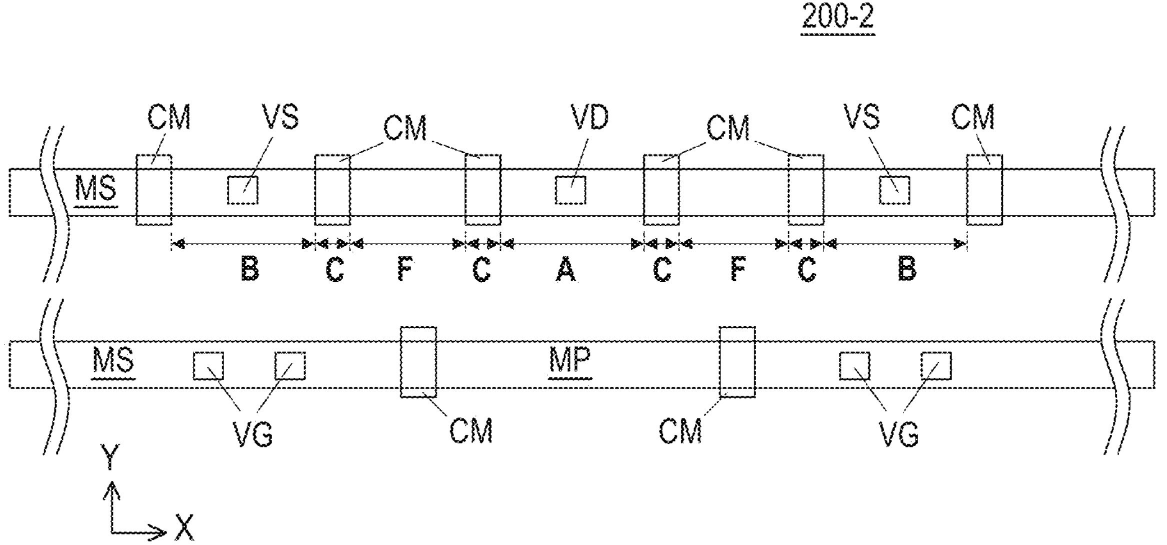
FIG. 2D is a diagram of an IC driver layout and device, in accordance with some embodiments.
Figure 2E:
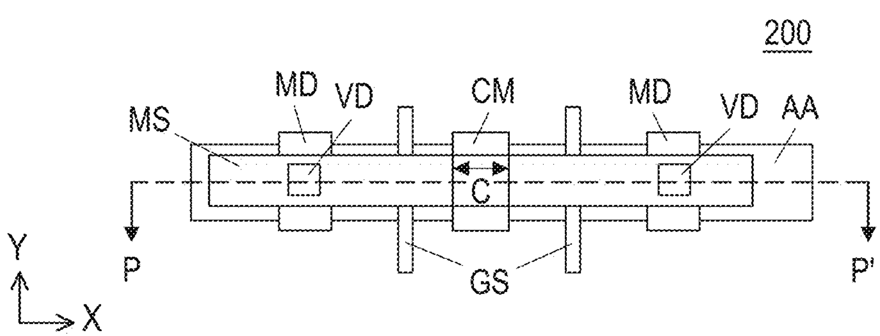
FIGS. 2E and 2F are plan views of an IC driver layout and device, in accordance with some embodiments.
Figure 2F:
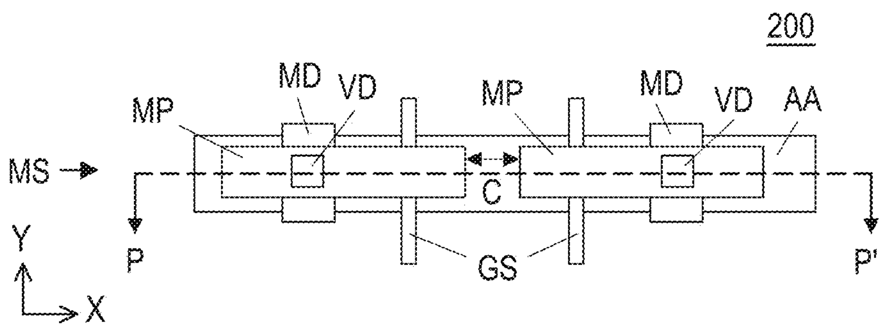
Figure 2G:
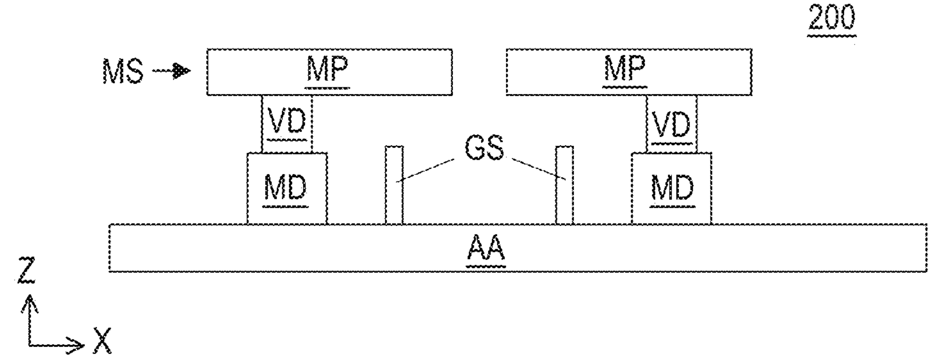
FIG. 2G is a cross-sectional view of an IC driver layout and device, in accordance with some embodiments.
Figure 3A:
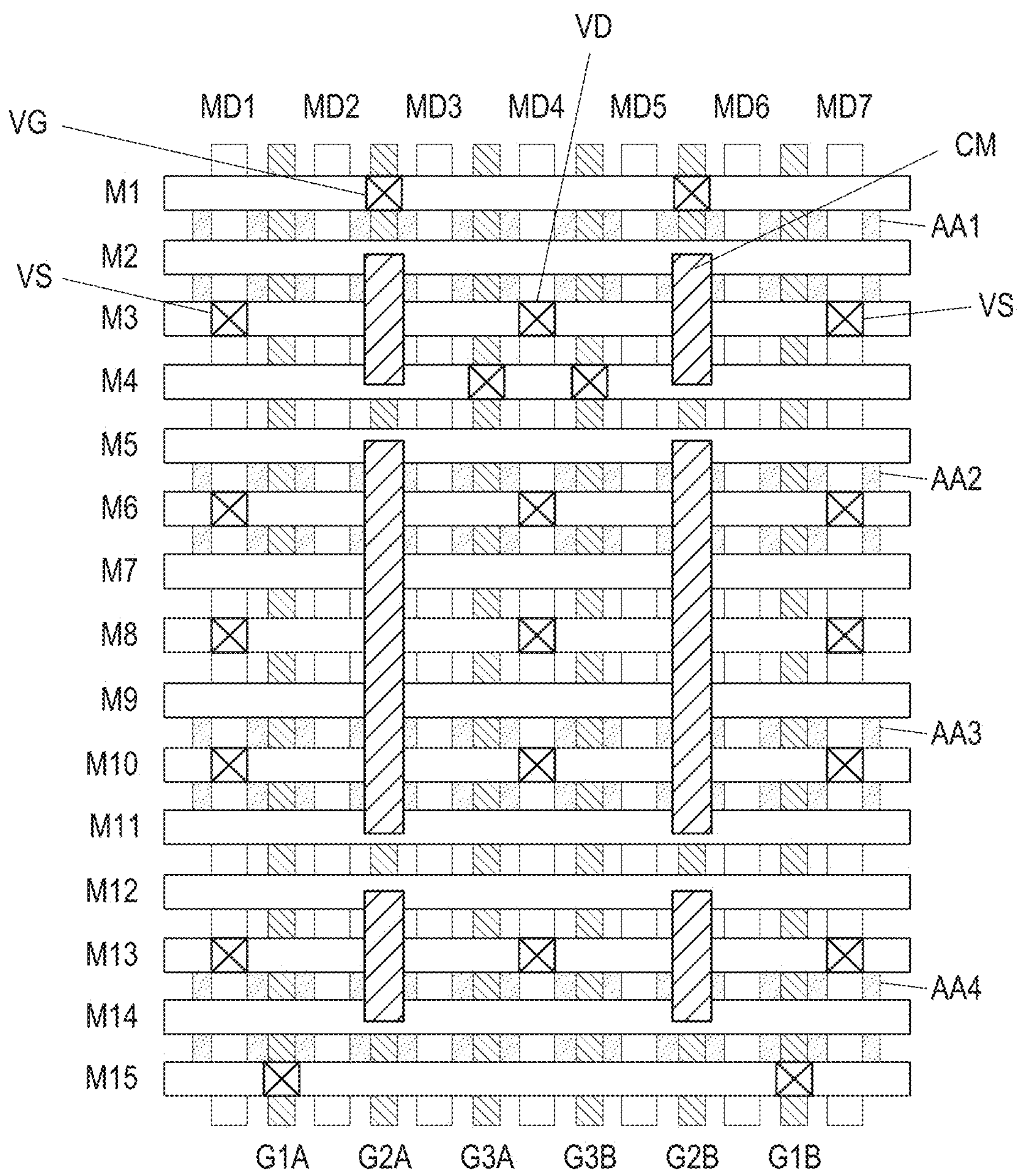
FIGS. 3A-3D are plan views of IC layout diagrams and corresponding IC driver devices, in accordance with some embodiments.
Figure 3B:
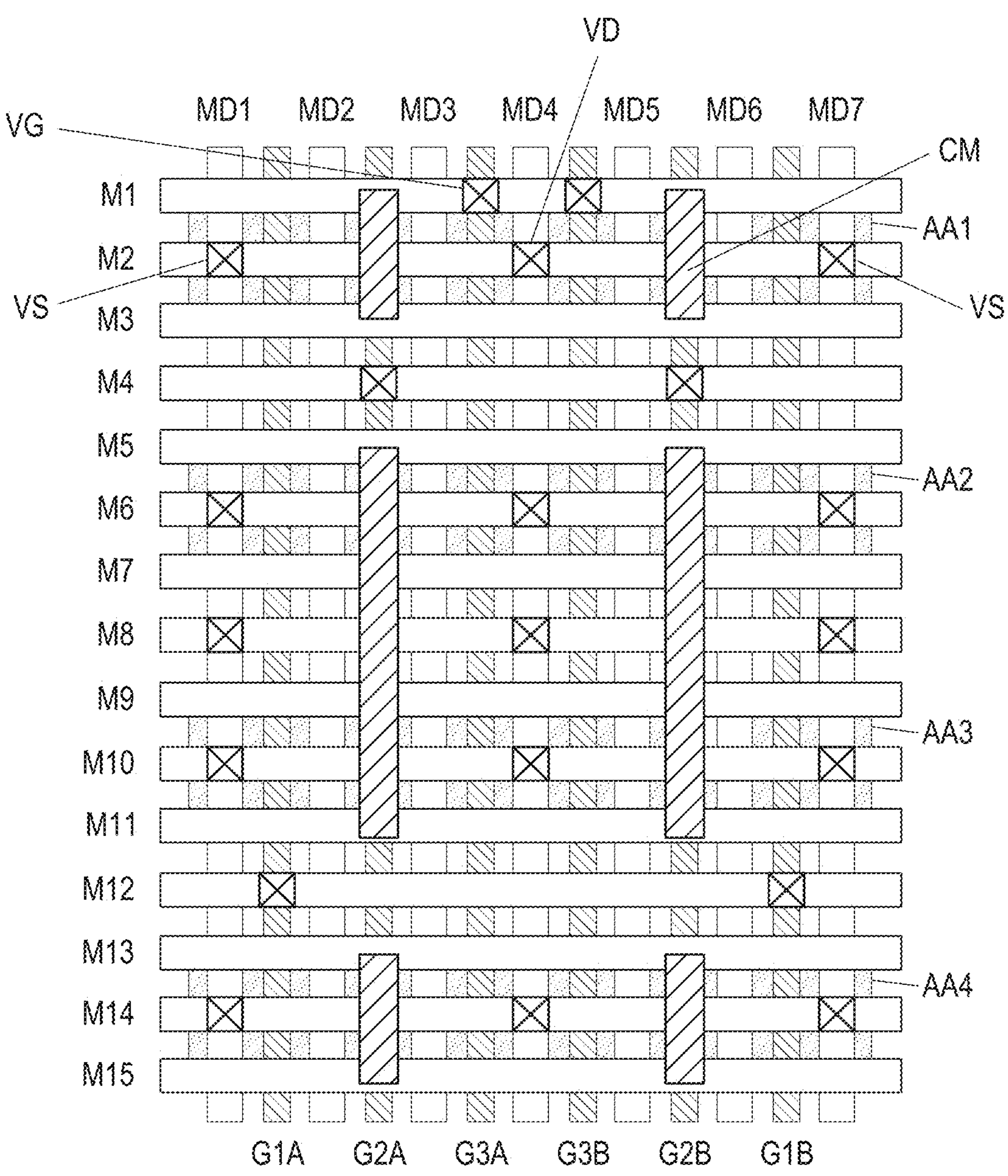
Figure 3C:
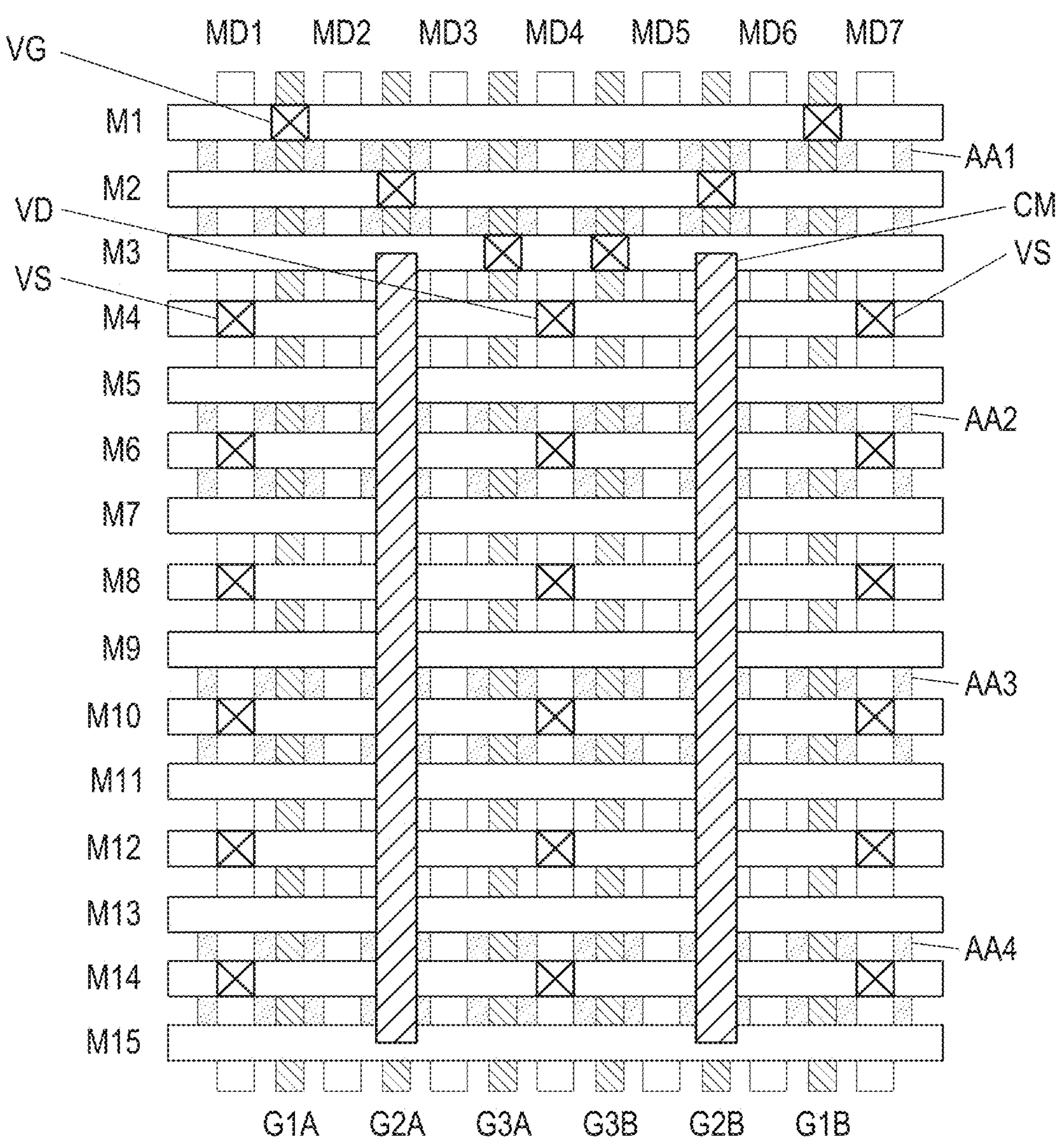
Figure 3D:
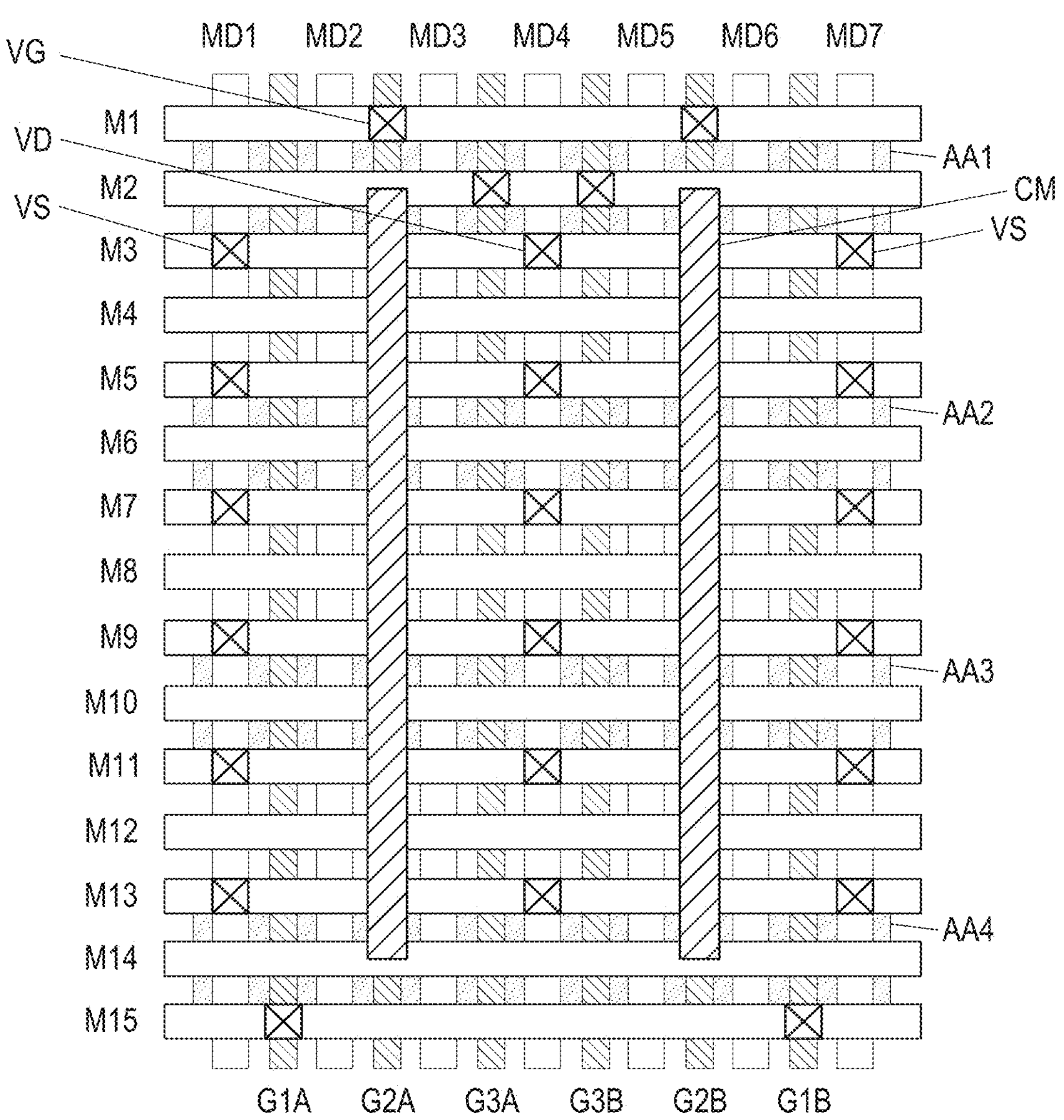
Figure 4A:
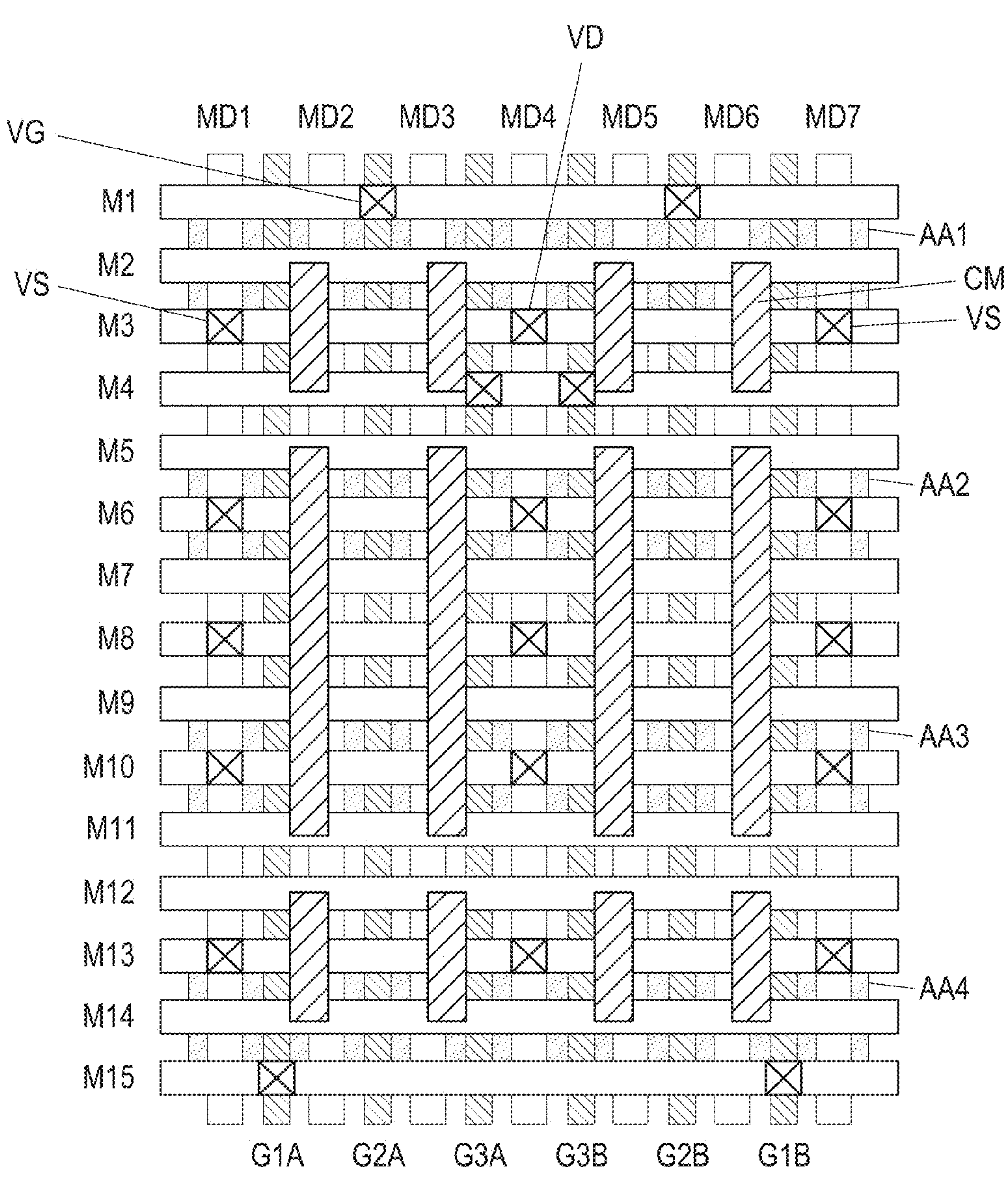
FIGS. 4A-4D are plan views of IC layout diagrams and corresponding IC driver devices, in accordance with some embodiments.
Figure 4B:
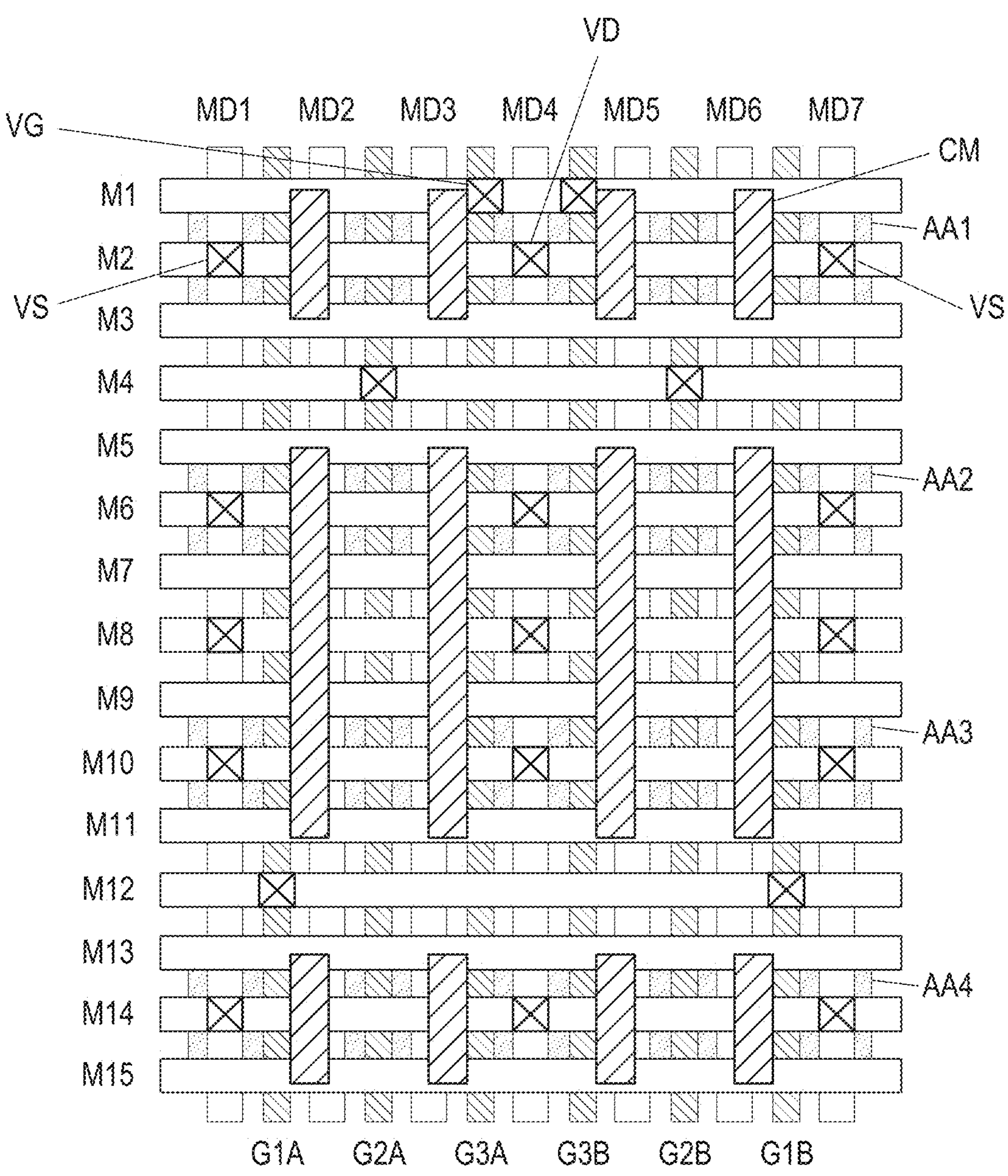
Figure 4C:
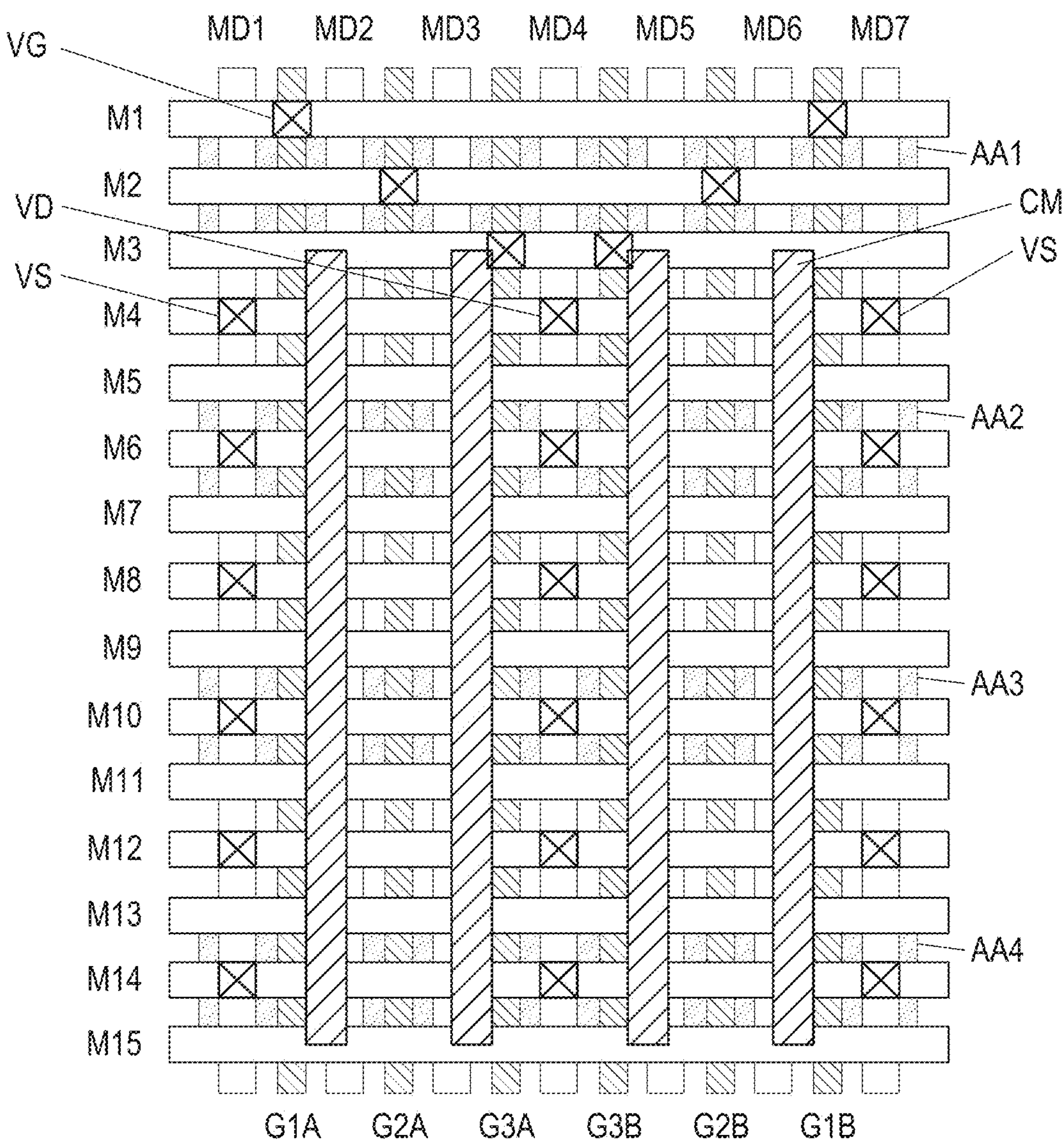
Figure 4D:
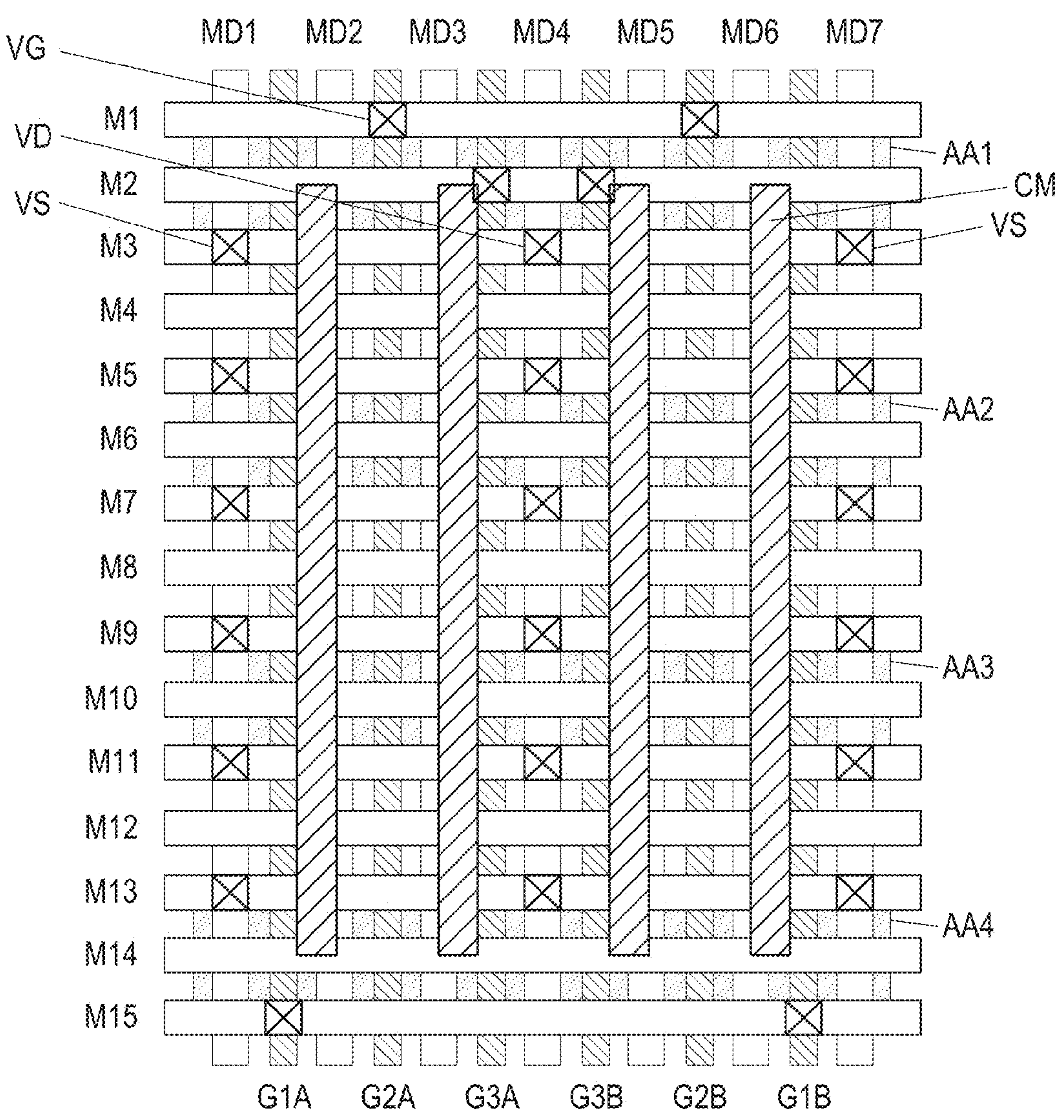

FIG. 2A is a schematic diagram of an IC driver device 200, in accordance with some embodiments; FIG. 2B depicts a plan view of a corresponding device/layout diagram of IC driver device 200, also referred to as an IC layout diagram 200 or an IC layout/device 200; FIGS. 2C and 2D depict plan views of IC layouts/devices 200-1 and 200-2, non-limiting examples of IC layout/device 200; and FIGS. 2E-2G depict plan views and a corresponding cross-sectional view of an embodiment of IC layout/device 200, in accordance with some embodiments.

Each of IC layouts/devices 200, 200-1, and 200-2 corresponds to a cascode arrangement of transistors capable of being included in driver 100D of circuit 100 discussed above. Each transistor in the cascode arrangement of transistors includes a parallel configuration of multiple transistor implementations, each implementation including at least two active area portions intersected by corresponding gate structures, as discussed below.

As depicted in FIG. 2A, IC driver device 200 includes a cascode arrangement of a total number x of transistors T1-Tx coupled between nodes NS and ND, also referred to as source node NS and drain node ND in some embodiments, and transistors T1-Tx including respective gate regions/structures G1-Gx configured to receive corresponding gate control signals G1-Gx. In various embodiments, IC driver device 200 includes the total number x=2, 3, or a greater number of transistors.

Transistor T1, and thereby the cascode arrangement of transistors T1-Tx, includes one or more source terminals electrically coupled to node NS. Transistor Tx, and thereby the cascode arrangement of transistors T1-Tx, includes one or more drain terminals electrically coupled to node ND.

In some embodiments, transistors T1-Tx including gate regions/structures G1-Gx configured to receive gate control signals G1-Gx include PMOS transistors, e.g., transistors P1 and P2 configured to receive gate control signals GP, node NS corresponds to a power supply voltage node, e.g., power supply voltage node VDDPST, and node ND corresponds to an output node, e.g., output node OUTP, each discussed above with respect to FIG. 1.

In some embodiments, transistors T1-Tx including gate regions/structures G1-Gx configured to receive gate control signals G1-Gx include NMOS transistors, e.g., transistors N1 and N2 configured to receive gate control signals GN, node NS corresponds to a power supply reference node, e.g., reference node VSS, and node ND corresponds to an output node, e.g., output node OUTP, each discussed above with respect to FIG. 1.

Each of FIGS. 2B-2F depicts a plan view of features of various embodiments of IC layout/device 200 along with X and Y directions. In the embodiments depicted in FIGS. 2B-2D, IC layout/device 200 includes one or more instances of a metal region/segment MS and/or an instance of an active region/area AA, each extending in the X direction and aligned along the Y direction with the other of the one or more instances of metal region/segment MS and/or instance of active region/area AA, as discussed below.

In some embodiments, the instances of metal region/segment MS depicted in FIGS. 2B-2D are separated into instances of a metal portion MP by instances of a cut-metal region CM, as illustrated in FIG. 2E. In some embodiments, the instances of metal region/segment MS depicted in FIGS. 2B-2D correspond to a plurality of separately defined metal regions/segments (represented as metal regions/segments MP) separated by spaces (greater than or equal to a minimum spacing rule distance) instead of instances of cut-metal regions CM, as illustrated in FIG. 2F. Each of the plan views depicted in FIGS. 2E and 2F thereby corresponds to the cross-sectional view depicted in FIG. 2G.

As depicted in FIGS. 2B-2G, IC layout/device 200 also includes instances of via regions/structures VS, VD, and VG, also referred to as source terminal vias VS, drain terminal vias VD, and gate vias VG in some embodiments, instances of gate regions/structures G1-Gx and GS, and instances of metal-like defined (MD) regions/segments MDS1, MDS2, MDD, and MD. In some embodiments, MD regions/segments MDS1, MDS2, and MDD are referred to as source terminals MDS1 and MDS2 and drain terminal MDD, respectively.

In some embodiments, IC layout/device 200 includes various features in addition to those depicted in FIGS. 2B-2G, e.g., one or more power rails or other metal interconnects, one or more additional instances of metal region/segment MS and or one or more instances of active region/area AA such as active regions/areas AA1-AA4 discussed below with respect to FIGS. 3A-4D.

An active region/area, e.g., active region/area AA or AA1-AA4, is a region in the IC layout diagram included in the manufacturing process as part of defining an active area, also referred to as an oxide diffusion or definition (OD), in the semiconductor substrate, either directly or in an n-well or p-well region/area (not shown for the purpose of clarity), in which one or more IC device features, e.g., a S/D structure, is formed. In some embodiments, an active area is an n-type or p-type active area of a planar transistor, a fin field-effect transistor (FinFET), or a gate-all-around (GAA) transistor. In various embodiments, an active area (structure) includes one or more of a semiconductor material, e.g., silicon (Si), silicon-germanium (SiGe), silicon-carbide (SIC), or the like, a dopant material, e.g., boron (B), phosphorous (P), arsenic (As), gallium (Ga), or another suitable material.

In some embodiments, an active area is a region in an IC layout diagram included in the manufacturing process as part of defining a nano-sheet structure, e.g., a continuous volume of one or more layers of one or more semiconductor materials having either n-type or p-type doping. In various embodiments, individual nano-sheet layers include a single monolayer or multiple monolayers of a given semiconductor material.

An MD region/segment, e.g., a region/segment MDS1, MDS2, MDD, or MD, is a conductive region in the IC layout diagram included in the manufacturing process as part of defining an MD segment, also referred to as a conductive segment or MD conductive line or trace, in and/or on the semiconductor substrate. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., the first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more dopant materials having doping concentrations of about $1*10^{16}$ per cubic centimeter ($cm^{-3}$) or greater.

In some embodiments, a manufacturing process includes two MD layers, and an MD region/segment refers to either or both of the two MD layers in the manufacturing process.

In some embodiments, a location at which an MD region/segment overlaps an active region/area corresponds to a S/D region/structure of a transistor including the relevant portions of the corresponding active region/area and MD region/segment.

A gate region/structure, e.g., a gate region/structure G1-Gx or GS, is a region in the IC layout diagram included in the manufacturing process as part of defining a gate structure. A gate structure is a volume including one or more conductive segments, e.g., a gate electrode, including one or more conductive materials, e.g., polysilicon, copper (Cu), aluminum (Al), tungsten (W), cobalt (Co), ruthenium (Ru), or one or more other metals or other suitable materials, substantially surrounded by one or more insulating materials, the one or more conductive segments thereby being configured to control a voltage provided to an adjacent gate dielectric layer.

A dielectric layer, e.g., a gate dielectric layer, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide ($TiO_2$), suitable for providing a high electrical resistance between IC structure elements, i.e., a resistance level above a predetermined threshold corresponding to one or more tolerance levels of a resistance-based effect on circuit performance.

A metal region/segment, e.g., a metal region/segment MS, is a region in the IC layout diagram included in the manufacturing process as part of defining a metal segment structure including one or more conductive materials, e.g., polysilicon, copper (Cu), aluminum (Al), tungsten (W), cobalt (Co), ruthenium (Ru), or one or more other metals or other suitable materials, in a given metal layer of the manufacturing process. In various embodiments, a metal region/segment corresponds to a first metal layer (also referred to as a metal zero layer in some embodiments), or a second or higher level metal layer of the manufacturing process.

A cut-metal region, e.g., cut-metal region CM, is a region in the IC layout diagram included in the manufacturing process as part of defining a discontinuity in a given metal segment, thereby electrically isolating the corresponding adjacent metal segment portions, e.g., metal portions MP, from each other.

A via region/structure, e.g., a via region/structure VS, VD, or VG, is a region in the IC layout diagram included in the manufacturing process as part of defining a via structure including one or more conductive materials configured to provide an electrical connection between an overlying conductive structure, e.g., a metal segment MS, and an underlying conductive structure. The underlying conductive structure corresponds to an MD segment or S/D structure in the case of a via region/structure VS or VD, and a gate electrode in the case of a via region/structure VG.

Each via region/structure VS is included in an electrical connection (not depicted for the purpose of clarity) between an underlying MD region/segment corresponding to a source terminal of the cascode arrangement and node NS, and each via region/structure VD is included in an electrical connection (not depicted for the purpose of clarity) between an underlying MD region/segment corresponding to a drain terminal of the cascode arrangement and node ND. In some embodiments, an electrical connection includes one or more via regions/structures and one or more metal regions/segments overlapping/overlying the corresponding via region/structure VS or VD.

As depicted in FIG. 2B, an instance of via region/structure VS is aligned in the Y direction with MD region/segment MDS1, indicating an electrical connection between the instance of via region/structure VS and MD region/segment MDS1, an instance of via region/structure VD is aligned in the Y direction with MD region/segment MDD, indicating an electrical connection between the instance of via region/structure VD and MD region/segment MDD, and an instance of via region/structure VS is aligned in the Y direction with MD region/segment MDS2, indicating an electrical connection between the instance of via region/structure VS and MD region/segment MDS2.

In various embodiments, an instance of a via region/structure is electrically connected to a corresponding MD region/segment at a location overlapping/overlying active region/area AA or at a location offset from active region/area AA in the Y direction, e.g., overlapping/overlying another active region/area (not depicted in FIG. 2B) corresponding to a parallel transistor configuration, e.g., an active region/area AA1-AA4 discussed below with respect to FIGS. 3A-4D.

The number of via regions/structures VS and VD, number of corresponding MD regions/segments MDS1, MDD, and MDS2, and number of active regions/areas AA depicted in FIGS. 2A-2G are non-limiting examples provided for the purpose of illustration. Other numbers of the corresponding features are within the scope of the present disclosure.

In the embodiment depicted in FIG. 2B, instances of each of gate regions/structures G1-Gx and corresponding instances of MD regions/segments (not labeled for the purpose of clarity) intersect active region/area AA between MD region/segment MDD (a drain terminal of the cascode arrangement of transistors) and each of MD regions/segments MDS1 and MDS2 (source terminals of the cascode arrangement of transistors). In some embodiments, one or more additional instances of each of gate regions/structures G1-Gx and corresponding instances of MD regions/segments intersect active region/area AA between MD regions/segments MDS1 and/or MDS2 and/or other MD regions/segments configured as additional drain and/or source terminals of the cascode arrangement of transistors.

In the embodiment depicted in FIG. 2B, a single instance of a source or drain terminal, e.g., MD region/segment MDS1, MDS2, or MDD corresponds to a single instance of a respective via region/structure VS or VD. In some embodiments, e.g., IC layout/device 300A-400D discussed below with respect to FIGS. 3A-4D, a single instance of a source or drain terminal corresponds to multiple instances of the respective via region/structure VS or VD electrically connected in parallel between the corresponding source or drain terminal and node NS or ND.

As depicted in FIG. 2B, instances of via regions/structures VS and VD are positioned along metal region/segment MS in the X direction at locations corresponding to the respective instances of source and drain terminals, e.g., MD regions/segments MDS1, MDS2, and MDD. Between each of the locations, metal region/segment MS is separated into two or more metal portions MP by one or more cut-metal regions CM, the number of metal portions MP being one greater than the number of cut-metal regions CM.

In the embodiment depicted in FIGS. 2A-2G, metal region/segment MS is positioned in a first metal layer of the manufacturing process used to form IC device 200, and cut-metal regions CM correspond to the first metal layer. In some embodiments, metal region/segment MS is referred to as a metal zero region/segment MS, and cut-metal regions CM are referred to as cut-metal zero regions CM.

In some embodiments, as depicted in FIGS. 2B-2E and 3A-4D, a corresponding IC layout diagram includes each cut-metal region CM corresponding to a discontinuity in a metal segment, e.g., metal segment MS, such that the adjacent metal portions, e.g., metal portions MP, in the corresponding IC device are aligned in the X direction and electrically isolated from each other.

In some embodiments, a given metal segment depicted in FIGS. 2B-2D, 2F and 3A-4D represents two or more electrically isolated metal regions/segments, e.g., metal regions/segments MP, in the corresponding layout diagram/device aligned in the X direction and separated by a discontinuity other than a cut-metal region, e.g., natural ends of the metal regions/segments based on discontinuous portions of the metal region used to at least partially define the given metal segment. In such embodiments, the corresponding IC layout diagram does not include instances of cut-metal region CM, and the references to metal portions, e.g., metal portions MP, in the discussion below correspond to instances of metal regions/segments, e.g., metal regions/segments MP.

In the embodiment depicted in FIG. 2B, metal region/segment MS is divided into a total of four metal portions MP corresponding to three cut-metal regions CM (or other discontinuities) between instances of via regions/structures VS and VD. In various embodiments, metal region/segment MS is divided into a total of fewer or greater than four metal portions MP based on a corresponding number of one fewer cut-metal regions CM (or other discontinuities) between instances of via regions/structures VS and VD.

A given metal portion MP located between cut-metal regions CM (or other discontinuities) and free from being electrically connected to a source or drain terminal is configured to, in addition to being electrically isolated from adjacent metal portions MP, to be electrically isolated from other IC features and is thereby configured to electrically float. Thus, a total number N−1 of floating metal portions MP between instances of via regions/structures VS and VD is one fewer than a total number N of cut-metal regions CM (or other discontinuities) between instances of via regions/structures VS and VD.

For a given dielectric material positioned between adjacent metal portions MP, a maximum difference in corresponding voltage levels depends on a width C of the corresponding cut-metal region CM (or other discontinuity). An overall maximum difference in the node NS/ND voltages further depends on the total number N−1 of floating metal portions MP between the instances of via regions/structures VS and VD such that the maximum difference in the node NS/ND voltage difference increases as the number N−1 of floating metal portions MP increases.

As a value of width C increases, the maximum difference in corresponding voltage levels capable of being sustained across width C increases. In some embodiments, width C corresponds to cut-metal region CM and has a value ranging from 3 nanometers (nm) to 30 nm. In some embodiments, width C corresponds to cut-metal region CM and has a value ranging from 5 nm to 20 nm. In some embodiments, width C corresponds to natural ends of metal portions MP and has a value ranging from 30 nm to 75 nm. In some embodiments, width C corresponds to natural ends of metal portions MP and has a value ranging from 35 nm to 60 nm.

A distance between via regions/structures VS and VD depends on the total number x of transistors T1-Tx, and thereby on gate regions/structures G1-Gx and a contact poly-pitch (cpp), the distance between centers of adjacent gate regions/structures G1-Gx. Along the X direction, a metal portion MP electrically connected to via region/structure VD has a width A, a metal portion MP electrically connected to via region/structure VS has a width B, a cut-metal region CM (or other discontinuity) has width C, and a floating metal portion MP has a width F. In various embodiments, each of widths A, B, and F has a same value, one of widths A, B, or F has a value different than values of the other of widths A, B, or F, or each of widths A, B, and F has a unique value.

For embodiments in which the total number x of transistors is greater than or equal to two, a distance between centers of the adjacent instances of via regions/structures VS as depicted in FIG. 2B is given by $$2*cpp*x=A+B+2*N*C+2*(N-1)*F \qquad (1)$$

In some embodiments, a value of the total number N of cut-metal regions CM (or other discontinuities) positioned between instances of via regions/structures VS and VD is thereby capable of being determined based on the overall maximum difference in the node NS/ND voltages, the number x of transistors T1-Tx in the cascode arrangement, and the dimensions and spacing design rules of the manufacturing process used to form IC layout/device 200.

FIG. 2C depicts a non-limiting example of IC layout/device 200, IC layout/device 200-1, in which distance C is sufficiently large to be capable of sustaining an entirety of a maximum node VS/VD voltage difference such that the total number N of cut-metal regions CM (or other discontinuities) between instances of via regions/structures VS and VD is equal to one. Accordingly, IC layout/device 200-1 is free from including floating metal portions MP, and the distance between enters of the adjacent instances of via regions/structures VS is given by $$2*cpp*x=A+B+2*C \qquad (2)$$

FIG. 2D depicts a non-limiting example of IC layout/device 200, IC layout/device 200-2, in which distance C is insufficiently large to be capable of sustaining an entirety of a maximum node VS/VD voltage difference, but sufficiently large such that a total number N of cut-metal regions CM (or other discontinuities) between instances via regions/structures VS and VD equal to two is capable of sustaining an entirety of a maximum node VS/VD voltage difference. Accordingly, IC layout/device 200-2 includes single instances of floating metal portions MP between adjacent via regions/structures VS and VD, and the distance between enters of the adjacent instances of via regions/structures VS is given by $$2*cpp*x=A+B+4*C+2*F \qquad (3)$$

Each of FIGS. 2C and 2D further depicts a second instance of metal region/segment MS corresponding to gate region/structure G1 (depicted in FIGS. 2A and 2B). Four instances of via region/structure VG are aligned along metal region/segment MS in the X direction, a first pair proximate to a first instance of via region/structure VS and a second pair proximate to a second instance of via region/structure VS. Two instances of cut-metal region CM (or other discontinuity) are positioned between the two pairs such that a single instance of a floating metal portion MP is positioned between the two pairs proximate to the instance of via region/structure VD.

By including this floating metal portion MP, the instances of metal region/segment MS depicted in FIGS. 2C and 2D are capable of being positioned adjacent to each other such that a difference between a voltage on the metal portion MP corresponding to via region/structure VD and a voltage on the metal portions MP corresponding to via region/structures VG is capable of exceeding a value based on an entirety of the second instance of metal region/segment MS being electrically connected to via region/structures VG.

The embodiment of the second instance of metal region/segment MS depicted in FIGS. 2C and 2D is a non-limiting example provided for the purpose of illustration. In some embodiments, greater than two instances of cut-metal region CM (or other discontinuity) are positioned between the two pairs such that two or more corresponding instances of a floating metal portion MP are positioned between the two pairs of via regions/structures VG. In some embodiments, instances of cut-metal region CM (or other discontinuity) are positioned between single instances of via regions/structures VG. In some embodiments, the second instance of metal region/segment MS corresponds to one of gate regions/structures G2-Gx.

Each of FIGS. 2E and 2F depicts a plan view, and FIG. 2G depicts an associated cross-sectional view (including the X direction and a Z direction) along a line P-P' of a non-limiting representative subset of features of IC layout/device 200 provided for the purpose of illustration. Each of the plan and cross-sectional views includes active region/area AA, instances of gate regions/structures GS and MD regions/structures MD overlapping/overlying active region/area AA, instances of via regions/structures VD overlapping/overlying the instances of MD regions/structures MD, and instances of metal portions MP or metal regions/segments MP (of an instance of metal region/segment MS) overlapping/overlying the instances of via regions/structures VD.

In the embodiment depicted in FIG. 2E, the instances of metal portions MP correspond to a single instance of cut-metal region CM intersecting the instance of metal region/segment MS and having width C. In the embodiment depicted in FIG. 2F, the instances of metal regions/segments MP correspond to a discontinuity in metal region/segment MS other than cut-metal region CM and having width C. Each of FIGS. 2E and 2F thereby corresponds to metal portions MP or metal regions/segments MP being electrically isolated and aligned along the X direction as depicted in the cross-sectional view of FIG. 2G.

By the configurations discussed above in which one or more cut-metal regions CM (or other discontinuities) are positioned in metal segment MS between the instances of via regions/structures VS and VD, the metal portions MP corresponding to via structures VS adjacent to via structures VD are electrically isolated from each other, thereby enabling the via regions/structures VS and VD to be included in electrical connections to nodes NS and ND configured to carry different voltage levels.

The single metal segment MS including components of both source and drain electrical connections enables the cascode arrangement of transistors of IC layout/device 200 to include a larger number of parallel source and drain electrical connections for a given circuit area compared to approaches in which a single metal segment does not include components of both source and drain electrical connections. Back-end (BE) source and drain path resistance is thereby reduced and speed performance improved, particularly when the cascode transistor arrangement is included in a driver stage of an output circuit, e.g., an input/output (I/O) circuit based solely on core transistors of a manufacturing process.

FIGS. 3A-4D are plan views of respective IC layout diagrams and corresponding IC driver devices 300A-400D, also referred to as IC layouts/devices 300A-400D, in accordance with some embodiments. Each IC layout/device 300A-400D corresponds to an embodiment of IC layout/device 200 discussed above with respect to FIGS. 2A-2G in which a cascode arrangement includes a total of 3 transistors T1-T3 (not labeled in FIGS. 3A-4D for the purpose of clarity).

The embodiments depicted in FIGS. 3A-3D correspond to IC layout/device 200-1 discussed above with respect to FIG. 2C, and the embodiments depicted in FIGS. 4A-4D correspond to IC layout/device 200-2 discussed above with respect to FIG. 2D.

Each of IC layouts/devices 300A-400D includes active regions/areas AA1-AA4, MD regions/segments MD1-MD7, gate regions/structures G1A-G3A and G1B-G3B, metal regions/segments M1-M15, instances of each of via regions/structures VS, VD, and VG (representative instances labeled for the purpose of clarity), and instances of cut-metal regions CM (representative instances labeled for the purpose of clarity). The portions of metal regions/segments M1-M15 positioned between the instances of cut-metal regions CM correspond to instances of metal portions MP and are not labeled for the purpose of clarity. In some embodiments, one or more of IC layouts 300A-400D does not include one or more of the instances of cut-metal regions CM, and the corresponding portions of metal regions/segments M1-M15 correspond to one or more pluralities of separately defined metal regions/segments, e.g., as discussed above with respect to FIGS. 2F and 2G.

In each of the embodiments depicted in FIGS. 3A-4D, transistor T1 includes eight parallel transistor implementations corresponding to the intersections of gate regions/structures G1A and G1B with each of active regions/areas AA1-AA4, transistor T2 includes eight parallel transistor implementations corresponding to the intersections of gate regions/structures G2A and G2B with each of active regions/areas AA1-AA4, and transistor T3 includes eight parallel transistor implementations corresponding to the intersections of gate regions/structures G3A and G3B with each of active regions/areas AA1-AA4. MD regions/segments MD1, MD4, and MD7 correspond to the respective first source terminal, drain terminal, and second source terminal of the cascode arrangement of transistors T1-T3.

In accordance with IC layout/device 200-1, IC layouts/devices 300A-300D include single instances of cut-metal regions CM (or other discontinuities) between via regions/structures VD corresponding to the drain terminal and via regions/structures VS corresponding to the first and second source terminals.

In accordance with IC layout/device 200-2, IC layouts/devices 400A-400D include two instances of cut-metal regions CM (or other discontinuities) between each via region/structure VD corresponding to the drain terminal and the corresponding via regions/structures VS corresponding to the first and second source terminals, thereby defining instances of floating metal portions MP between each of the two instances of cut-metal region CM (or other discontinuities).

Each of IC layout devices 300A and 400A includes instances of via region/structure VS configured to electrically connect each of MD regions/segments M1 and M7 to each of a total of five metal regions/segments M3, M6, M8, M10, and M13 as part of a source terminal connection, instances of via region/structure VD configured to electrically connect MD region/segment M4 to each of metal regions/segments M3, M6, M8, M10, and M13 as part of a drain terminal connection, instances of via region/structure VG configured to electrically connect each of gate regions/structures GIA and G1B to metal region/segment M15 as part of a gate connection of transistor T1, instances of via region/structure VG configured to electrically connect each of gate regions/structures G2A and G2B to metal region/segment M1 as part of a gate connection of transistor T2, and instances of via region/structure VG configured to electrically connect each of gate regions/structures G3A and G3B to metal region/segment M4 as part of a gate connection of transistor T3.

Each of IC layout devices 300B and 400B includes instances of via region/structure VS configured to electrically connect each of MD regions/segments M1 and M7 to each of a total of five metal regions/segments M2, M6, M8, M10, and M14 as part of a source terminal connection, instances of via region/structure VD configured to electrically connect MD region/segment M4 to each of metal regions/segments M2, M6, M8, M10, and M14 as part of a drain terminal connection, instances of via region/structure VG configured to electrically connect each of gate regions/structures G1A and G1B to metal region/segment M12 as part of a gate connection of transistor T1, instances of via region/structure VG configured to electrically connect each of gate regions/structures G2A and G2B to metal region/segment M4 as part of a gate connection of transistor T2, and instances of via region/structure VG configured to electrically connect each of gate regions/structures G3A and G3B to metal region/segment M1 as part of a gate connection of transistor T3.

Each of IC layout devices 300C and 400C includes instances of via region/structure VS configured to electrically connect each of MD regions/segments M1 and M7 to each of a total of six metal regions/segments M4, M6, M8, M10, M12, and M14 as part of a source terminal connection, instances of via region/structure VD configured to electrically connect MD region/segment M4 to each of metal regions/segments M4, M6, M8, M10, M12, and M14 as part of a drain terminal connection, instances of via region/structure VG configured to electrically connect each of gate regions/structures G1A and G1B to metal region/segment M1 as part of a gate connection of transistor T1, instances of via region/structure VG configured to electrically connect each of gate regions/structures G2A and G2B to metal region/segment M2 as part of a gate connection of transistor T2, and instances of via region/structure VG configured to electrically connect each of gate regions/structures G3A and G3B to metal region/segment M3 as part of a gate connection of transistor T3.

Each of IC layout devices 300D and 400D includes instances of via region/structure VS configured to electrically connect each of MD regions/segments M1 and M7 to each of a total of six metal regions/segments M3, M5, M7, M9, M11, and M13 as part of a source terminal connection, instances of via region/structure VD configured to electrically connect MD region/segment M4 to each of metal regions/segments M3, M5, M7, M9, M11, and M13 as part of a drain terminal connection, instances of via region/structure VG configured to electrically connect each of gate regions/structures G1A and G1B to metal region/segment M15 as part of a gate connection of transistor T1, instances of via region/structure VG configured to electrically connect each of gate regions/structures G2A and G2B to metal region/segment M1 as part of a gate connection of transistor T2, and instances of via region/structure VG configured to electrically connect each of gate regions/structures G3A and G3B to metal region/segment M2 as part of a gate connection of transistor T3.

IC layouts/devices 300A-400D corresponding to IC layouts/devices 200-1 and 200-2 are non-limiting examples provided for the purpose of illustration. Other cascode transistor arrangements in accordance with IC layouts/devices 200-1 and 200-2 are within the scope of the present disclosure.

By including source and drain connections along single instances of metal regions/segments M1-M15 as discussed above, each of IC layouts/devices 300A-400D is capable of realizing the benefits discussed above with respect to IC layout/device 200 including IC layouts/devices 200-1 and 200-2.

Figure 5:
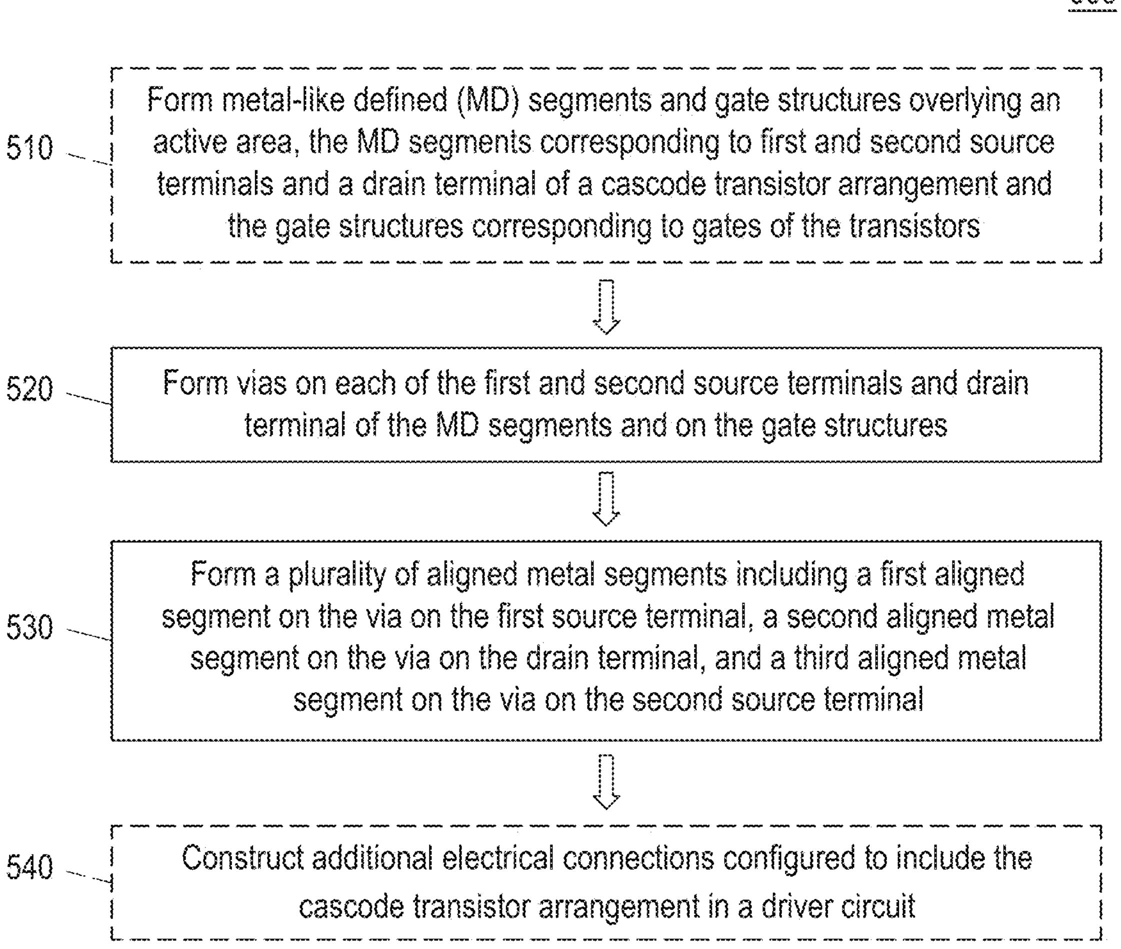
FIG. 5 is a flowchart of a method of manufacturing an IC driver device, in accordance with some embodiments.

FIG. 5 is a flowchart of a method 500 of manufacturing an IC device, in accordance with some embodiments. Method 500 is operable to form one or more of IC devices 200, 200-1, 200-2, or 300A-400D discussed above with respect to FIGS. 2A-4D.

In some embodiments, the operations of method 500 are performed in the order depicted in FIG. 5. In some embodiments, the operations of method 500 are performed in an order other than the order depicted in FIG. 5. In some embodiments, one or more additional operations are performed before, during, and/or after the operations of method 500. In some embodiments, performing some or all of the operations of method 500 includes performing one or more operations as discussed below with respect to IC manufacturing system 800 and FIG. 8.

At operation 510, in some embodiments, MD segments and gate structures are formed overlying an active area, the MD segments corresponding to first and second source terminals and a drain terminal of a cascode transistor arrangement and the gate structures corresponding to gates of the transistors. In some embodiments, forming the MD segments and gate structures overlying the active area includes forming MD segments MDS1, MDD, and MDS2 overlying active area AA discussed above with respect to FIGS. 2A-2G. In some embodiments, forming the MD segments and gate structures overlying the active area includes forming MD segments MD1-MD7 overlying active areas AA1-AA4 discussed above with respect to FIGS. 3A-4D.

In various embodiments, forming the MD segments and gate structures includes performing a plurality of manufacturing operations, e.g., one or more of a lithography, diffusion, deposition, etching, planarizing, or other operation suitable for depositing and forming one or more conductive and dielectric materials configured to form continuous, low resistance MD structures and gate structures as discussed above with respect to FIGS. 2A-2G.

At operation 520, vias are formed on each of the first and second source terminals and drain terminal of the MD segments and on the gate structures. In some embodiments, forming the vias on the first and second source terminals and drain terminal of the MD segments and on the gate structures includes forming via structures VS and VD on MD segments MDS1, MDD, and MDS2, and vias VG on gate structures G1-Gx discussed above with respect to FIGS. 2A-2G. In some embodiments, forming the vias on the first and second source terminals and drain terminal of the MD segments and on the gate structures includes forming via structures VS and VD on instances of MD segments MD1-MD7, and vias VG on instances of gate structures G1A-G13A and G1B-G3B discussed above with respect to FIGS. 3A-4D.

In various embodiments, forming the vias includes performing a plurality of manufacturing operations, e.g., one or more of a lithography, diffusion, deposition, etching, planarizing, or other operation suitable for constructing via structures in accordance with the configurations discussed above with respect to FIGS. 2B-4D.

At operation 530, a plurality of metal segments is formed on the vias, including three aligned segments formed on vias electrically connected to each of the first and second source terminals and the drain terminal. In some embodiments, forming the metal segments on the vias includes forming instances of metal segments MS on vias VS, VD, and VG, at least one instance of metal segment MS including three or more metal portions MP or metal regions/segments MP discussed above with respect to FIGS. 2A-2G. In some embodiments, forming the metal segments on the vias includes forming instances of metal segments M1-M15 on vias VS, VD, and VG discussed above with respect to FIGS. 3A-4D.

In various embodiments, forming the metal segments includes performing a plurality of manufacturing operations, e.g., one or more of a lithography, diffusion, deposition, etching, planarizing, or other operation suitable for constructing metal segments in accordance with the configurations discussed above with respect to FIGS. 2B-4D.

In some embodiments, forming the aligned metal segments includes performing a cut-metal operation after forming the corresponding metal segment(s) based on a cut-metal region, e.g., cut-metal region CM discussed above with respect to FIGS. 2B-4D. In some embodiments, forming the aligned metal segments includes forming natural ends on the metal segments, e.g., metal regions/segments MP discussed above with respect to FIGS. 2B-4D, as part of forming the corresponding metal segment(s).

At operation 540, in some embodiments, additional electrical connections are constructed configured to include the cascode transistor arrangement in a driver circuit. In some embodiments, the additional electrical connections includes constructing vias and metal segments overlying and electrically connected to the vias, e.g., vias VS, VD, and VG of IC device 200 discussed above with respect to FIGS. 2A-4D, configured to include the cascode transistor arrangement in circuit 100 discussed above with respect to FIG. 1.

In various embodiments, forming the additional electrical connections includes performing a plurality of manufacturing operations, e.g., one or more of a lithography, diffusion, deposition, etching, planarizing, or other operation suitable for constructing vias and metal segments in accordance with the configurations discussed above with respect to FIGS. 1-4D.

By performing some or all of the operations of method 500, a cascode arrangement of transistors is forming including source and drain connections along single instances of metal segments and thereby capable of realizing the benefits discussed above with respect to IC device 200 including IC devices 200-1 and 200-2.

Figure 6:
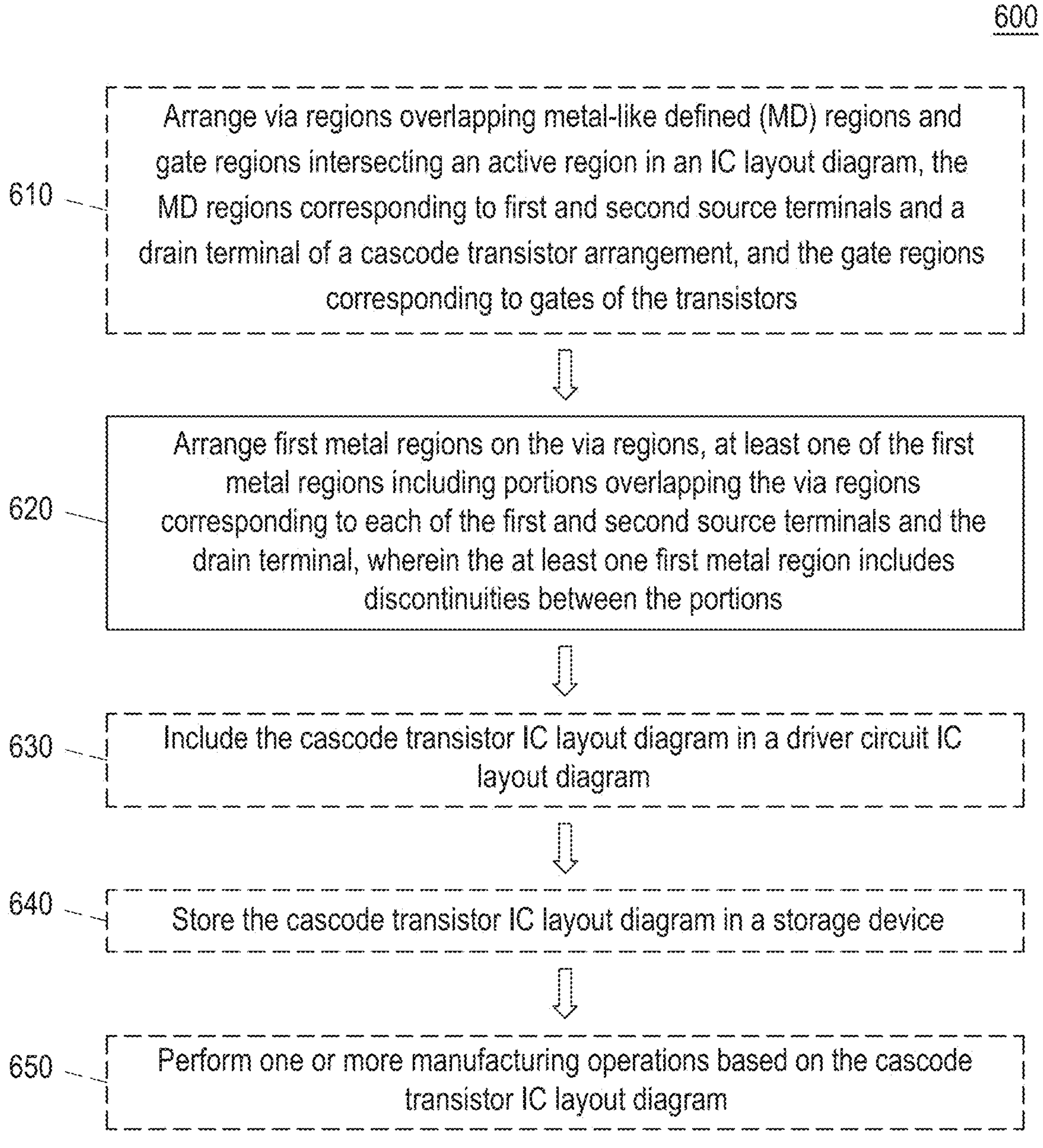
FIG. 6 is a flowchart of a method of generating an IC layout diagram, in accordance with some embodiments.

FIG. 6 is a flowchart of a method 600 of generating an IC layout diagram, e.g., an IC layout diagram 200, 200-1, 200-2, and/or 300A-400D discussed above with respect to FIGS. 2A-4D, in accordance with some embodiments.

In some embodiments, generating the IC layout diagram includes generating the IC layout diagram corresponding to an IC device, e.g., an IC device 200, 200-1, 200-2, and/or 300A-400D discussed above with respect to FIGS. 2A-4D, manufactured based on the generated IC layout diagram.

In some embodiments, some or all of method 600 is executed by a processor of a computer. e.g., a processor 702 of an IC layout diagram generation system 700, discussed below with respect to FIG. 7.

Some or all of the operations of method 600 are capable of being performed as part of a design procedure performed in a design house, e.g., a design house 820 discussed below with respect to FIG. 8.

In some embodiments, the operations of method 600 are performed in the order depicted in FIG. 6. In some embodiments, the operations of method 600 are performed simultaneously and/or in an order other than the order depicted in FIG. 6. In some embodiments, one or more operations are performed before, between, during, and/or after performing one or more operations of method 600.

At operation 610, in some embodiments, via regions are arranged overlapping MD regions and gate regions intersecting an active region in an IC layout diagram, the MD regions corresponding to first and second source terminals and a drain terminal of a cascode transistor arrangement, and the gate regions corresponding to gates of the transistors. In some embodiments, arranging the via regions includes arranging via regions VS. VD, and VG overlapping MD regions MDS1, MDS2, and MDD and gate regions G1-Gx intersecting active region AA in the IC layout diagram of the cascode transistor arrangement, the gate regions corresponding to gates G1-Gx discussed above with respect to FIGS. 2A-2G.

In some embodiments, arranging the via regions includes arranging via regions VS, VD, and VG overlapping MD regions MD1-MD7 and gate regions G1A-G3A and G1B-G3B intersecting active regions AA1-AA4 in one of IC layout diagrams 300A-400D discussed above with respect to FIGS. 3A-4D.

At operation 620, first metal regions are arranged on the via regions, at least one of the first metal regions including portions or aligned regions overlapping the via regions corresponding to each of the first and second source terminals and the drain terminal, wherein the at least one first metal region includes discontinuities between the portions or regions.

In some embodiments, arranging the first metal regions includes arranging instances of metal regions MS overlapping via regions VS, VD, and VG, at least one instance of metal region MS including metal portions MP or metal regions MP discussed above with respect to FIGS. 2A-2G. In some embodiments, arranging the first metal regions includes arranging instances of metal regions M1-M15 on via regions VS, VD, and VG discussed above with respect to FIGS. 3A-4D.

In some embodiments, including discontinuities between the portions includes arranging cut-metal regions, e.g., cut-metal regions CM discussed above with respect to FIGS. 2A-4D, at locations corresponding to the discontinuities. In some embodiments, including discontinuities between the portions includes arranging the first metal regions including natural ends of the metal portions or regions at locations corresponding to the discontinuities.

In some embodiments, arranging the first metal regions including the discontinuities between the portions includes determining a number of continuities based on one or more maximum voltage differences, one or more feature dimensions, and one or more manufacturing spacing rules as discussed above with respect to widths, A, B, C, and F and FIGS. 2B-2G.

At operation 630, in some embodiments, the cascode transistor IC layout diagram is included in a driver circuit IC diagram, e.g., an IC driver circuit diagram corresponding to circuit 100 discussed above with respect to FIG. 1.

At operation 640, in some embodiments, an IC layout diagram including the cascode transistor arrangement is stored in a storage device. In some embodiments, storing the IC layout diagram including the cascode transistor arrangement in the storage device includes storing the cell in an IC layout library, e.g., IC layout library 707 of IC layout diagram generation system 700, discussed below with respect to FIG. 7.

In various embodiments, storing the IC layout diagram in the storage device includes storing the IC layout diagram in a non-volatile, computer-readable memory and/or includes storing the IC layout diagram over a network, e.g., network 714 of IC layout diagram generation system 700, discussed below with respect to FIG. 7.

At operation 650, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed above with respect to FIG. 5 and below with respect to FIG. 8.

By executing some or all of the operations of method 600, an IC layout diagram is generated corresponding to a cascode arrangement of transistors including source and drain connections along single instances of metal segments and thereby capable of realizing the benefits discussed above with respect to IC device 200 including IC devices 200-1 and 200-2.

Figure 7:
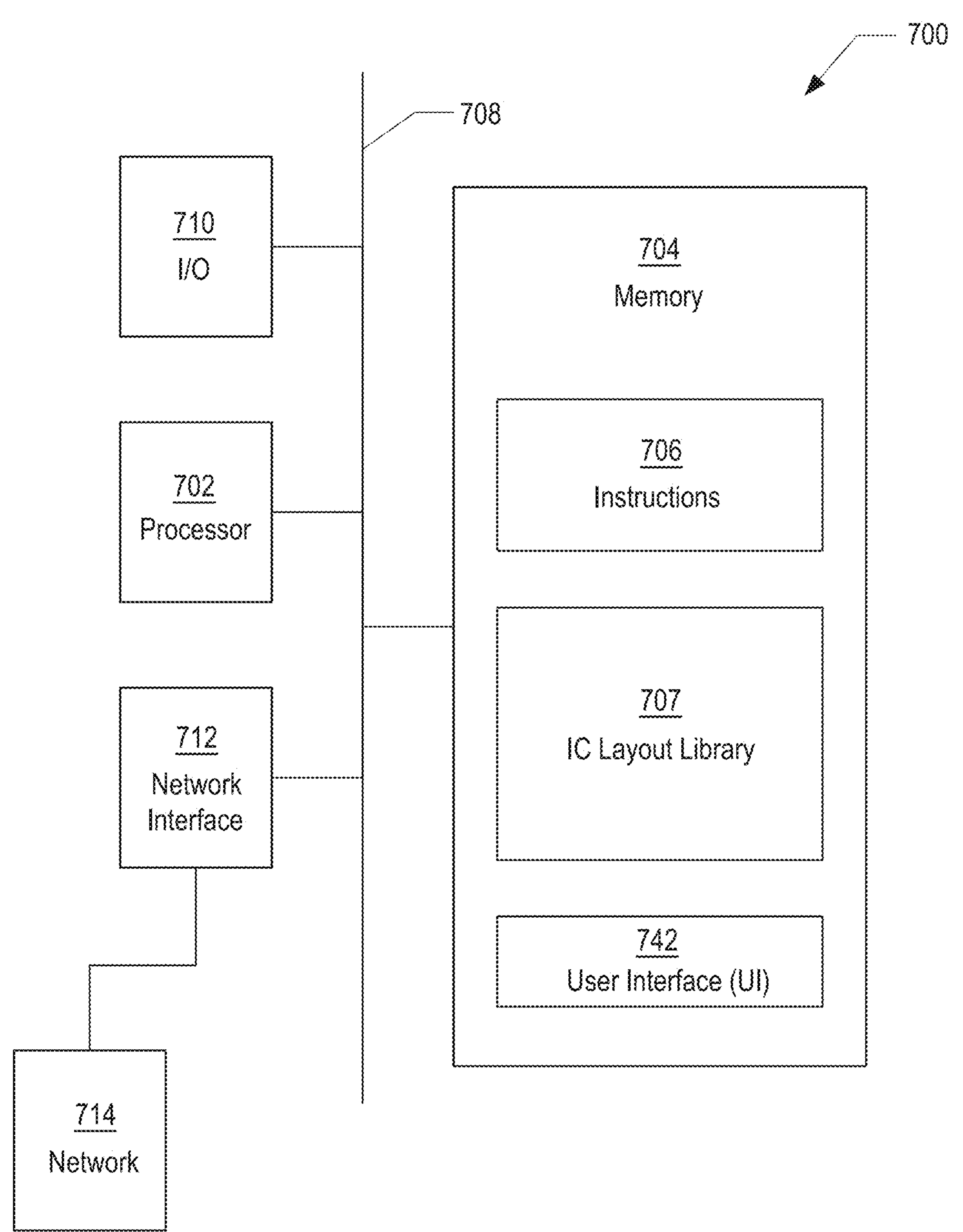
FIG. 7 is a block diagram of an IC layout diagram generation system, in accordance with some embodiments.

FIG. 7 is a block diagram of IC layout diagram generation system 700, in accordance with some embodiments. Methods described herein of designing IC layout diagrams in accordance with one or more embodiments are implementable, for example, using IC layout diagram generation system 700, in accordance with some embodiments.

In some embodiments, IC layout diagram generation system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of a method, e.g., method 600 of generating an IC layout diagram described above with respect to FIG. 6 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause IC layout diagram generation system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause IC layout diagram generation system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores IC layout library 707 of IC layout diagrams including such IC layout diagrams as disclosed herein, e.g., IC layout diagrams 200, 200-1, 200-1, and 300A-400D discussed above with respect to FIGS. 2A-4D.

IC layout diagram generation system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

IC layout diagram generation system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 700.

IC layout diagram generation system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. IC layout diagram generation system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
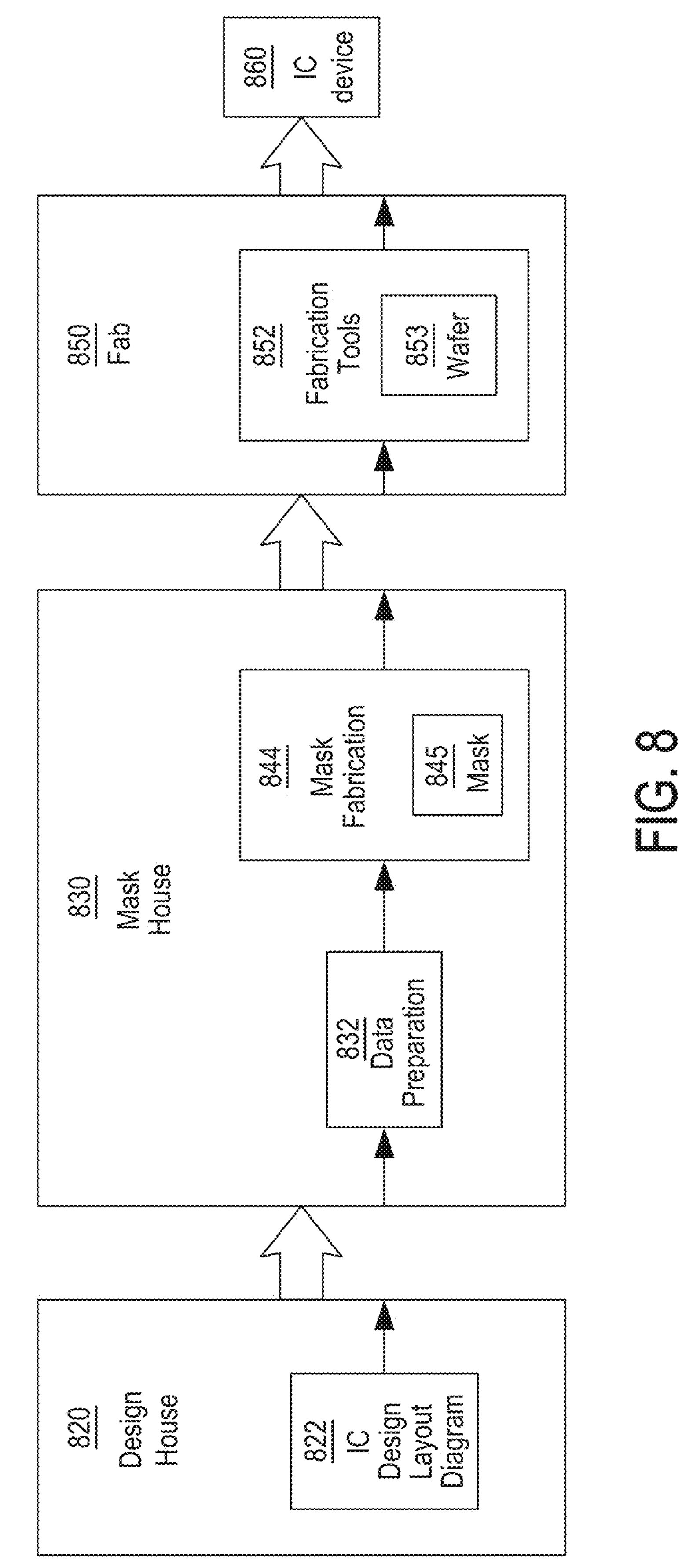
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram 200, 200-1, 200-1, or 300A-400D discussed above with respect to FIGS. 2A-4D. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

In some embodiments, an IC driver includes a cascode arrangement of first-type transistors coupled in series with a cascode arrangement of second-type transistors, the second type being different from the first type, wherein each of the cascode arrangement of first-type transistors and the cascode arrangement of second-type transistors includes an active area extending in a first direction, a plurality of gate structures extending in a second direction perpendicular to the first direction and overlying the active area at locations corresponding to the transistors of the cascode arrangement, first through fourth metal segments extending in the first direction in a first metal layer of the IC, first and second vias configured to electrically couple respective first and second gate structures of the plurality of gate structures to the first and second metal segments, respectively, a third via configured to electrically couple a source terminal of the cascode arrangement to the third metal segment, and a fourth via configured to electrically couple a drain terminal of the cascode arrangement to the fourth metal segment, wherein the third and fourth metal segments are aligned along the first direction.

In some embodiments, an IC includes a cascode arrangement of transistors, and the cascode arrangement of transistors includes first through fourth active areas extending in a first direction, first through sixth gate structures extending in a second direction perpendicular to the first direction and overlying each of the first through fourth active areas at locations corresponding to the transistors of the cascode arrangement, first through third metal segments extending in the first direction in a first metal layer overlying the first through sixth gate structures, first through fifth pluralities of aligned metal segments extending in the first direction in the first metal layer overlying the first through sixth gate structures, first and second vias configured to electrically couple the first and second gate structures to the first metal segment, third and fourth vias configured to electrically couple the third and fourth gate structures to the second metal segment, fifth and sixth vias configured to electrically couple the fifth and sixth gate structures to the third metal segment, seventh through eleventh vias configured to electrically couple a first source terminal of the cascode arrangement to a first aligned metal segment of each of the first through fifth pluralities of aligned metal segments, twelfth through sixteenth vias configured to electrically couple a drain terminal of the cascode arrangement to a second aligned metal segment of each of the first through fifth pluralities of aligned metal segments, and seventeenth through twenty-first vias configured to electrically couple a second source terminal of the cascode arrangement to a third aligned metal segment of each of the first through fifth pluralities of aligned metal segments.

In some embodiments, a method of manufacturing an IC device includes forming first through fifth vias on a first MD segment extending across first through fourth active areas in a semiconductor substrate, forming sixth through tenth vias on a second MD segment extending across the first through fourth active areas, forming eleventh through fifteenth vias on a third MD segment extending across the first through fourth active areas, forming sixteenth through eighteenth vias on corresponding first through third gate structures extending across the first through fourth active areas between the first and second MD segments, forming nineteenth through twenty-first vias on corresponding fourth through seventh gate structures extending across the first through fourth active areas between the second and third MD segments, forming a first metal segment on the sixteenth and nineteenth vias, a second metal segment on the seventeenth and twentieth vias, and a third metal segment on the eighteenth and twenty-first vias, and forming a first aligned metal segment of each of first through fifth pluralities of aligned metal segments on a corresponding via of the first through fifth vias, a second aligned metal segment of each of the first through fifth pluralities of aligned metal segments on a corresponding via of the sixth through tenth vias, and a third aligned metal segment of each of the first through fifth pluralities of aligned metal segments on a corresponding via of the eleventh through fifteenth vias.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) driver comprising:

a cascode arrangement of first-type transistors coupled in series with a cascode arrangement of second-type transistors, the second type being different from the first type, wherein each of the cascode arrangement of first-type transistors and the cascode arrangement of second-type transistors comprises:

an active area extending in a first direction;

a plurality of gate structures extending in a second direction perpendicular to the first direction and overlying the active area at locations corresponding to the transistors of the cascode arrangement;

first through fifth metal segments extending in the first direction in a first metal layer of the IC;

first and second vias configured to electrically couple respective first and second gate structures of the plurality of gate structures to the first and second metal segments, respectively;

a third via configured to electrically couple a source terminal of the cascode arrangement to the third metal segment; and a fourth via configured to electrically couple a drain terminal of the cascode arrangement to the fourth metal segment, wherein:

the third and fourth metal segments are aligned along the first direction, and the fifth metal segment extends in the first direction between the first and second metal segments and is electrically isolated from each of the first through fourth metal segments.

2. The IC driver of claim 1, wherein each of the cascode arrangement of first-type transistors and the cascode arrangement of second-type transistors further comprises:

a sixth metal segment extending in the first direction between the third and fourth metal segments, wherein the sixth metal segment is configured to electrically float.

3. The IC driver of claim 1, wherein the source terminal of each of the cascode arrangement of first-type transistors and the cascode arrangement of second-type transistors is a first source terminal of the corresponding first-type or second-type transistor cascode arrangement, and each of the cascode arrangement of first-type transistors and the cascode arrangement of second-type transistors further comprises:

a sixth metal segment aligned with the third and fourth metal segments along the first direction; and a fifth via configured to electrically couple a second source terminal of the cascode arrangement to the sixth metal segment.

4. The IC driver of claim 1, wherein each of the cascode arrangement of first-type transistors and the cascode arrangement of second-type transistors further comprises:

a fifth via configured to couple a third gate structure of the plurality of gate structures to the first metal segment, wherein the locations at which the first and third gate structures of the plurality of gate structures overlie the active area correspond to parallel configurations of the corresponding transistors of the cascode arrangement.

5. The IC driver of claim 1, wherein the cascode arrangement of first-type transistors and the cascode arrangement of second-type transistors further comprises:

a sixth metal segment aligned with the first metal segment along the first direction; and a fifth via configured to couple a third gate structure of the plurality of gate structures to the sixth metal segment.

6. The IC driver of claim 1, wherein, for each of the cascode arrangement of first-type transistors and the cascode arrangement of second-type transistors:

the active area is a first active area of the corresponding cascode arrangement, the locations corresponding to the transistors of the cascode arrangement are first locations corresponding to first transistors of the cascode arrangement, the cascode arrangement further comprises a second active area extending in the first direction, and the plurality of gate structures overlies the second active area at second locations corresponding to second transistors of the cascode arrangement configured in parallel with the first transistors of the cascode arrangement.

7. The IC driver of claim 6, wherein each of the cascode arrangement of first-type transistors and the cascode arrangement of second-type transistors further comprises:

sixth and seventh metal segments aligned along the first direction in the first metal layer;

a fifth via configured to electrically couple the source terminal of the cascode arrangement to the sixth metal segment; and a sixth via configured to electrically couple the drain terminal of the cascode arrangement to the seventh metal segment.

8. The IC driver of claim 7, wherein each of the cascode arrangement of first-type transistors and the cascode arrangement of second-type transistors further comprises:

an eighth metal segment extending in the first direction between the third and fourth metal segments; and a ninth metal segment extending in the first direction between the sixth and seventh metal segments, wherein each of the eighth metal segment and the ninth metal segment is configured to electrically float.

9. The IC driver of claim 1, wherein, for at least one of the cascode arrangement of first-type transistors or the cascode arrangement of second-type transistors, the third and fourth metal segments are separated by a distance corresponding to a cut-metal operation of a manufacturing process corresponding to the IC.

10. The IC driver of claim 1, wherein the first-type and second-type transistors comprise p-type and n-type metal oxide semiconductor (PMOS and NMOS) transistors, respectively, the source terminal of the cascode arrangement of first-type transistors is electrically coupled to a power supply node of the IC driver, the source terminal of the cascode arrangement of second-type transistors is electrically coupled to a reference node of the IC driver, and each of the drain terminal of the cascode arrangement of first-type transistors and the drain terminal of the cascode arrangement of second-type transistors is electrically coupled to an output node of the IC driver.

11. An integrated circuit (IC) comprising a cascode arrangement of transistors, the cascode arrangement of transistors comprising:

first through fourth active areas extending in a first direction;

first through sixth gate structures extending in a second direction perpendicular to the first direction and overlying each of the first through fourth active areas at locations corresponding to the transistors of the cascode arrangement;

first through third metal segments extending in the first direction in a first metal layer overlying the first through sixth gate structures;

first through fifth pluralities of aligned metal segments extending in the first direction in the first metal layer overlying the first through sixth gate structures;

first and second vias configured to electrically couple the first and second gate structures to the first metal segment;

third and fourth vias configured to electrically couple the third and fourth gate structures to the second metal segment;

fifth and sixth vias configured to electrically couple the fifth and sixth gate structures to the third metal segment;

seventh through eleventh vias configured to electrically couple a first source terminal of the cascode arrangement to a first aligned metal segment of each of the first through fifth pluralities of aligned metal segments;

twelfth through sixteenth vias configured to electrically couple a drain terminal of the cascode arrangement to a second aligned metal segment of each of the first through fifth pluralities of aligned metal segments; and seventeenth through twenty-first vias configured to electrically couple a second source terminal of the cascode arrangement to a third aligned metal segment of each of the first through fifth pluralities of aligned metal segments.

12. The IC of claim 11, wherein each of the first through fifth pluralities of aligned metal segments further comprises:

a fourth aligned metal segment extending between the first and second aligned metal segments; and a fifth aligned metal segment extending between the second and third aligned metal segments.

13. The IC of claim 11, further comprising:

first through seventh conductive segments extending in the second direction and overlying each of the first through fourth active areas, wherein the first through sixth gate structures alternate with the first through seventh conductive segments with respect to the first direction, the first through sixth gate structures are located between the first source terminal comprising the first conductive segment and the second source terminal comprising the seventh conductive segment, the first, third, and fifth gate structures are located between the first source terminal and the drain terminal comprising the fourth conductive segment, and the second, fourth, and sixth gate structures are located between the drain terminal and the second source terminal.

14. The IC of claim 11, wherein the transistors comprise p-type metal-oxide-semiconductor (PMOS) transistors, the first and second source terminals are electrically coupled to a power supply node of a driver circuit, and the drain terminal is electrically coupled to an output node of the driver circuit.

15. The IC of claim 11, wherein the transistors comprise n-type metal-oxide-semiconductor (NMOS) transistors, the first and second source terminals are electrically coupled to a reference node of a driver circuit, and the drain terminal is electrically coupled to an output node of the driver circuit.

16. An integrated circuit (IC) driver comprising:

a power supply node;

a reference node;

an output node;

a cascode arrangement of p-type transistors coupled between the power supply node and the output node; and a cascode arrangement of n-type transistors coupled between the output node and the reference node, wherein each of the cascode arrangement of p-type transistors and the cascode arrangement of n-type transistors comprises:

an active area extending in a first direction and comprising a source node and a drain node;

a plurality of gate structures extending in a second direction perpendicular to the first direction and overlying the active area at locations corresponding to the transistors of the cascode arrangement;

first and second metal segments extending in the first direction in a first metal layer of the IC;

first and second vias configured to electrically couple first and second gate structures of the plurality of gate structures to the respective first and second metal segments;

a third metal segment extending in the first direction in the first metal layer of the IC and electrically coupled either to the power supply node in the cascode arrangement of p-type transistors or to the reference node in the cascode arrangement of n-type transistors;

a fourth metal segment extending in the first direction in the first metal layer of the IC and aligned with the third metal segment in the first direction;

a third via configured to electrically couple the source node to the third metal segment;

a fourth via configured to electrically couple the drain node to the fourth metal segment; and a fifth metal segment extending in the first direction between the first and second metal segments and electrically isolated from each of the first through fifth metal segments.

17. The IC driver of claim 16, wherein each of the cascode arrangement of p-type transistors and the cascode arrangement of n-type transistors further comprises:

a sixth metal segment extending in the first direction between the third and fourth metal segments and electrically isolated from each of the first through fifth metal segments.

18. The IC driver of claim 16, wherein each of the cascode arrangement of p-type transistors and the cascode arrangement of n-type transistors further comprises:

a first conductive segment between the third via and the source node; and a second conductive segment between the fourth via and the drain node.

19. The IC driver of claim 16, wherein each of the cascode arrangement of p-type transistors and the cascode arrangement of n-type transistors comprises a total of two transistors.

20. The IC driver of claim 16, wherein the first metal segment is configured to receive a first gate control signal, and the second metal segment is configured to receive a second gate control signal.

* * * * *